US007732268B2

(12) United States Patent
Shimmoto et al.

(10) Patent No.: US 7,732,268 B2
(45) Date of Patent: Jun. 8, 2010

(54) MANUFACTURING METHOD OF DISPLAY DEVICE

(75) Inventors: Hideaki Shimmoto, Toyokawa (JP); Mikio Hongo, Yokohoma (JP); Akio Yazaki, Yokohama (JP); Takeshi Noda, Mobara (JP); Takuo Kaitoh, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 420 days.

(21) Appl. No.: 11/882,828

(22) Filed: Aug. 6, 2007

(65) Prior Publication Data

US 2008/0050893 A1 Feb. 28, 2008

(30) Foreign Application Priority Data

Aug. 24, 2006 (JP) ............................ 2006-227265

(51) Int. Cl.
*H01L 21/00* (2006.01)

(52) U.S. Cl. .................. 438/166; 257/72; 257/E21.134

(58) Field of Classification Search ................. 438/166; 257/72, E21.134

See application file for complete search history.

(56) References Cited

U.S. PATENT DOCUMENTS 5,413,958 A 5/1995 Imahashi et al.
2001/0000243 A1* 4/2001 Sugano et al. ............. 438/166
2002/0072252 A1 6/2002 Nakajima et al.
2003/0017658 A1* 1/2003 Nishitani et al. ............ 438/149
2003/0094585 A1* 5/2003 Hara et al. ............. 250/492.23

FOREIGN PATENT DOCUMENTS

| | | |
|---|---|---|
| JP | 6-61172 | 8/1992 |
| JP | 8-129189 | 11/1993 |
| JP | 2002-64060 | 8/2000 |
| JP | 2002-158173 | 9/2001 |

* cited by examiner

*Primary Examiner*—Steven J Fulk
(74) *Attorney, Agent, or Firm*—Stites & Harbison PLLC; Juan Carlos A. Marquez, Esq.

(57) ABSTRACT

A method of manufacturing a display device to improve the quality of a polycrystal silicon upon dehydrogenating and polycrystallizing an amorphous silicon at the outside of a display region of a substrate, by forming a plurality of pixels having TFT devices using an amorphous silicon in the display region of the substrate, and forming a plurality of driving circuits having semiconductor devices using a polycrystal silicon at the outside of the display region, the method including irradiation of a first continuous oscillation laser only to the amorphous silicon in the region for forming the driving circuit and the peripheral region thereof to conduct dehydrogenation and then irradiation of a second continuous oscillation region only to the dehydrogenated region to polycrystallize the amorphous silicon, wherein the region to which the first continuous oscillation laser is irradiated is wider than the region to which the second continuous oscillation laser is irradiated.

14 Claims, 15 Drawing Sheets

MANUFACTURING METHOD OF DISPLAY DEVICE

CLAIM OF PRIORITY

The present application claims priority from Japanese Application JP 2006-227265 filed on Aug. 24, 2006, the content of which is hereby incorporated by reference into this application.

BACKGROUND OF THE INVENTION

1. Field of the Invention

The present invention relates to a manufacturing method of a display device and it particularly relates to a technique effective to application for a manufacturing method of forming a driving circuit having semiconductor devices on the outside of a display region including an assembly of pixels having TFT devices.

2. Description of the Related Art

Existent liquid crystal display devices having liquid display panels in which a liquid crystal material is sealed between a pair of substrates include active matrix type TFT liquid crystal display devices. The active matrix type TFT liquid crystal display device is used generally, for example, as displays of television receivers or personal computers (PC) and display areas for mobile telephone terminals or personal digital assistances (PDA).

In a liquid crystal display panel used for the active matrix type TFT liquid crystal display device, a plurality of scanning signals lines, a plurality of video signals lines, TFT devices, pixel electrodes, and the like are disposed on one of substrates.

Generally, in an existent liquid crystal display device, a flexible circuit substrate such as TCP or COF mounted with a driver IC for inputting video signals (sometimes also referred to as gradation data) to the plurality of video signal lines or a driver IC for inputting scanning signals to the plurality of scanning signal lines is connected to the liquid crystal display panel, or each of the driver IC is mounted directly on the liquid crystal display panel.

Further, in recent years, a liquid crystal display panel in which a driving circuit having a function equivalent with that of the driver IC (peripheral circuit) is formed to the outside of the display region of a substrate formed with the scanning signal lines (hereinafter referred to as a TFT substrate) is proposed for instance.

The driving circuit formed to the outside of the display region of the TFT substrate is mainly constituted with semiconductor devices such as transistors or diodes and the electrodes for each of the semiconductor devices are formed upon forming the scanning signal lines or the video signal lines, and the semiconductor layer of the semiconductor device is formed upon forming the semiconductor layer of the TFT device (channel layer) of the display region. For the semiconductor layer of the TFT device formed in the display region of the TFT substrate, an amorphous silicon (a-Si) or a polycrystal silicon (poly-Si) is used for instance.

By the way, polycrystal silicon is used preferably for the semiconductor layer of the semiconductor device in the driving circuit in view of the operation characteristics. In this case, a method of polycrystallizing the entire surface of an amorphous silicon on a substrate by dehydrogenating amorphous silicon by a heat treatment, and irradiating and scanning a pulse laser such as an excimer laser to the dehydrogenated amorphous silicon while displacing the same stepwise little by little so as to be irradiated by plural times for one position.

Further, JP-A-2002-158173 and JP-A-2002-64060, for example, disclose a method of hydrogenating an amorphous silicon by using a laser beam instead of heat treatment. In JP-A-2002-158173, dehydrogenation is conducted by a first excimer laser and polycrystallization is conducted by a second excimer laser. Further, in JP-A-2002-64060, a pulse laser beam is bisected and dehydrogenation is conducted by a preceding beam and polycrystallization is conducted by a beam succeeding thereto.

Further, although not intended for dehydrogenation, JP-A-Hei-6-61172 discloses of conducting annealing by two lasers of different energy density in relation with the use of the two lasers. A pulse layer or a continuous oscillation laser is used for the two lasers.

Further, JP-A-Hei-8-129189 discloses a method of polycrystallization only in the driving circuit portion instead of polycrystallization over the entire surface of an amorphous silicon. In JP-A-Hei-8-129189, upon constituting the pixel with hydrogenated silicon and the driving circuit with polycrystal silicon, one pulse laser is used, the energy of the pulse of the laser light is increased stepwise and crystallization is conducted while dehydrogenating the hydrogenated amorphous semiconductor only in the driving circuit portion.

In a case of manufacturing a TFT substrate using an amorphous silicon for the semiconductor layer of a TFT device in a display region and using a polycrystal silicon for the semiconductor layer of a semiconductor device in a driving circuit to the outside of the display region, while it is preferred to use a hydrogenated amorphous silicon as the amorphous silicon in view of the characteristics, since bumping occurs upon irradiation of a laser unless dehydrogenation is conducted upon polycrystallization, it is necessary for partial dehydrogenation only for the driving circuit portion.

However, since the partially dehydrogenated region and the crystallized region completely coincide to each other in JP-A Nos. 2002-158173 and 2002-64060, and 8-129189, in a case where the position for irradiation is displaced upon irradiation of a laser for conducting crystallization, the laser for crystallization may possibly be irradiated to the not dehydrogenated region at the boundary between the hydrogenated region and the not dehydrogenated region and, as a result, bumping may possibly occur.

While dehydrogenation is not described in JP-A No. Hei 6-61172, since the two laser irradiation regions coincide to each other, it is considered that a similar problem may occur in a case of intending application to the hydrogenation and the crystallization.

Further, the pulse laser is a laser intermittently emitting (generating) a light at a time interval. Accordingly, in a case of melting and crystallizing an amorphous silicon into polycrystals by irradiation of the pulse laser, this results in a problem that the size of individual granular crystals is small to form a number of crystal grain boundaries. As a result, it results in a problem that the carrier mobility is low in the TFT device of the driving circuit, failing to obtain sufficient transistor characteristics.

The present invention intends to provide a technique capable of improving the quality of a polycrystal silicon upon dehydrogenating and polycrystallizing an amorphous silicon at the outside of a display region of a substrate.

The invention further intends to provide a technique capable of improving the manufacturing efficiency of a TFT substrate using an amorphous silicon for a semiconductor layer of a TFT device in a display region and using a polycrystal silicon for the semiconductor layer of the semiconductor device of the driving circuit at the outside of the display region.

The foregoing and other objects and novel features of the present invention will become apparent in view of the descriptions of the present specification and the accompanying drawings.

SUMMARY OF THE INVENTION

The outlines for typical inventions among those disclosed in the present application are as described below.

(1) A method of manufacturing a display device including;

a first step of depositing a hydrogenated amorphous silicon on a substrate and a second step of dehydrogenating a predetermined region of the hydrogenated amorphous silicon and then melting and crystallizing the amorphous silicon in the hydrogenated region into polycrystal silicon, forming a plurality of pixels having TFT devices using an amorphous silicon in a display region of the substrate, and forming driving circuits having a plurality of semiconductor devices using the polycrystal silicon to the outside of the display region, wherein the second step conducts irradiation of a first continuous oscillation laser only to the region of forming the driving circuit and the peripheral region thereof at the outside of the display region of the substrate to conduct dehydrogenation and then irradiation of a second continuous oscillation laser only to the dehydrogenated region to form the amorphous silicon into a polycrystal silicon in which the region of irradiating the first continuous oscillation region is wider than the region of irradiating the second continuous oscillation laser.

(2) A method of manufacturing a display device according to (1) above, wherein the first continuous oscillation laser and the second continuous oscillation laser are irradiated while scanning over the substrate, the energy density of the first continuous oscillation laser is lower than the energy density of the second continuous oscillation laser, and the time for the irradiation of the first continuous oscillation laser is longer than the time for the irradiation of the second continuous oscillation laser on each of the points in the region for the irradiation of the first continuous oscillation laser and the second continuous oscillation laser.

(3) A method of manufacturing a display device according to (2) above, wherein the beam width in the scanning direction of the first continuous oscillation laser is wider than the beam width of the scanning direction of the second continuous oscillation laser.

(4) A method of manufacturing a display device according to (2) above, wherein the scanning speed of the first continuous oscillation laser is different from the scanning speed of the second continuous oscillation laser.

(5) A method of manufacturing a display device according to (4) above, wherein the scanning speed of the first continuous oscillation laser is slower than the scanning speed of the second continuous oscillation laser.

(6) A method of manufacturing a display device according to any one of (1) to (5) above, wherein the second step conducts irradiation of the first continuous oscillation laser and the second continuous oscillation laser during scanning of a strip-like region on the substrate in a first direction.

(7) A method of manufacturing a display device according to (6) above, wherein the second step conducts scanning for a strip-like region on the substrate in the first direction and then scanning for a strip-like region different from said strip-like region on the substrate in the direction opposite to the first direction.

(8) A method of manufacturing a display device according to any one of (1) to (7) above, wherein the second step conducts irradiation of a third continuous oscillation laser to a region formed into polycrystal silicon by the irradiation of the second continuous oscillation laser.

(9) A method of manufacturing a display device according to (8) above, wherein the second step conducts irradiation of the first continuous oscillation laser, the second continuous oscillation laser, and the third continuous oscillation laser during scanning of a strip-like region on the substrate in the first direction.

(10) A method of manufacturing a display device according to (8) or (9) above, wherein the second step conducts scanning for a strip-like region of the substrate in the first direction, then scanning for a strip-like region different from said strip-like region in the direction opposed to the first direction, conducts irradiation of the third continuous oscillation laser upon scanning the different stripe-like region to dehydrogenate the hydrogenated amorphous silicon film, irradiation of the second continuous oscillation laser to the amorphous silicon dehydrogenated by the third continuous oscillation laser into polycrystal silicon, and irradiation of the first continuous oscillation laser to the region formed into the polycrystal silicon by the irradiation of the second continuous oscillation laser.

(11) A method of manufacturing a display device according to (10) above, wherein the focal point of the first continuous oscillation laser and the focal point of the third continuous oscillation laser are switched to each other between the scanning in the first direction and the scanning in the direction opposite to the first direction on the substrate.

The manufacturing method of the display device according to the invention can prevent occurrence of bumping near the outer circumference of the hydrogenated region upon irradiation of the continuous oscillation laser for crystallization, and prevent degradation of the quality of silicon crystals at the outer periphery of the region formed into polycrystal silicon.

BRIEF DESCRIPTION OF THE DRAWINGS

The present invention is to be described in details in conjunction with the preferred embodiments with reference to the drawings, wherein.

Throughout the drawings for explaining the preferred embodiments, those having identical functions carry the same reference numerals, for which duplicate descriptions are to be omitted.

DESCRIPTION OF PREFERRED EMBODIMENTS OF THE INVENTION

The invention is applied to a method of manufacturing a display device provided with a substrate having TFT devices in a display region and having semiconductor devices such as other TFT devices and diodes to the outside of the display region, in which the semiconductor layer of the TFT devices in the display region is formed of an amorphous silicon (a-Si) and the semiconductor layer of the semiconductor devices to the outside of the display region is formed of a polycrystal silicon (poly-Si). Then, a constitutional embodiment of a display device (display panel) to which the invention is applied is to be described.

Figure 1A:
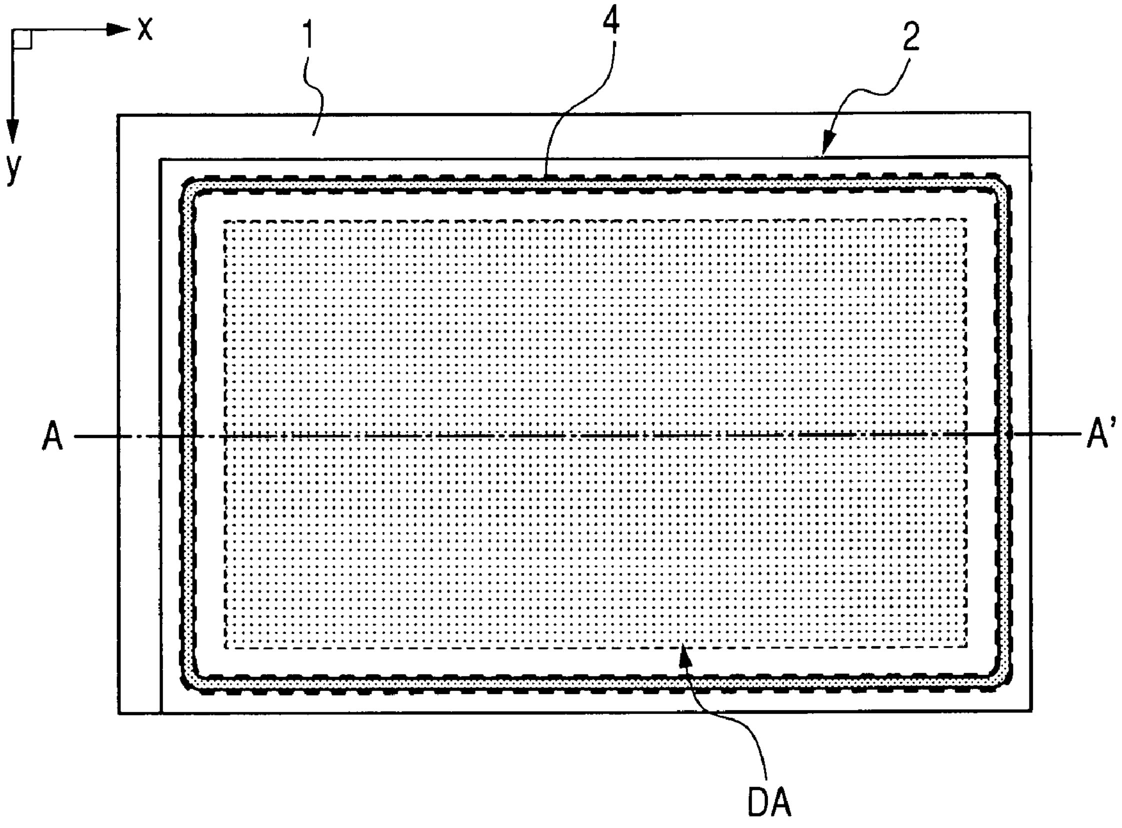
FIG. 1A is a schematic plan view showing an outlined constitution of a liquid display panel to which the invention is applied.
Figure 1B:
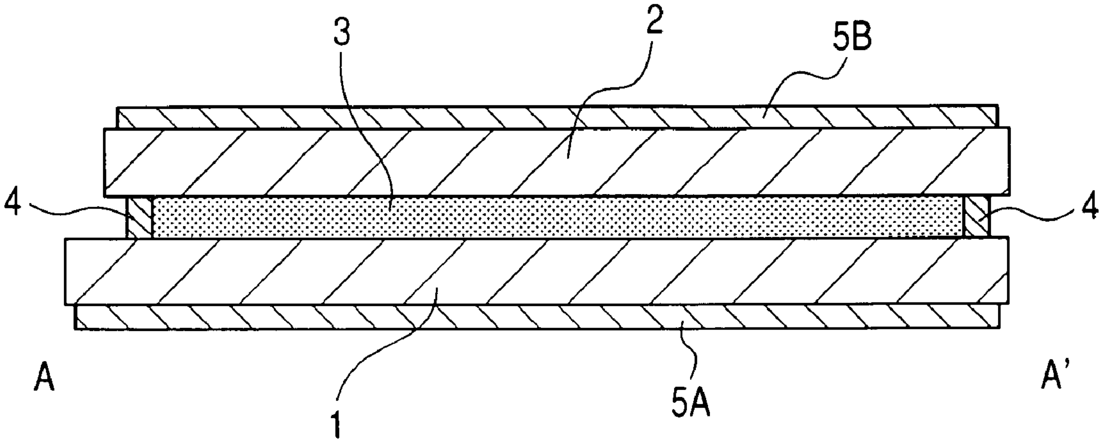
FIG. 1B is a cross sectional view taken along line A-A' in FIG. 1A.
Figure 2:
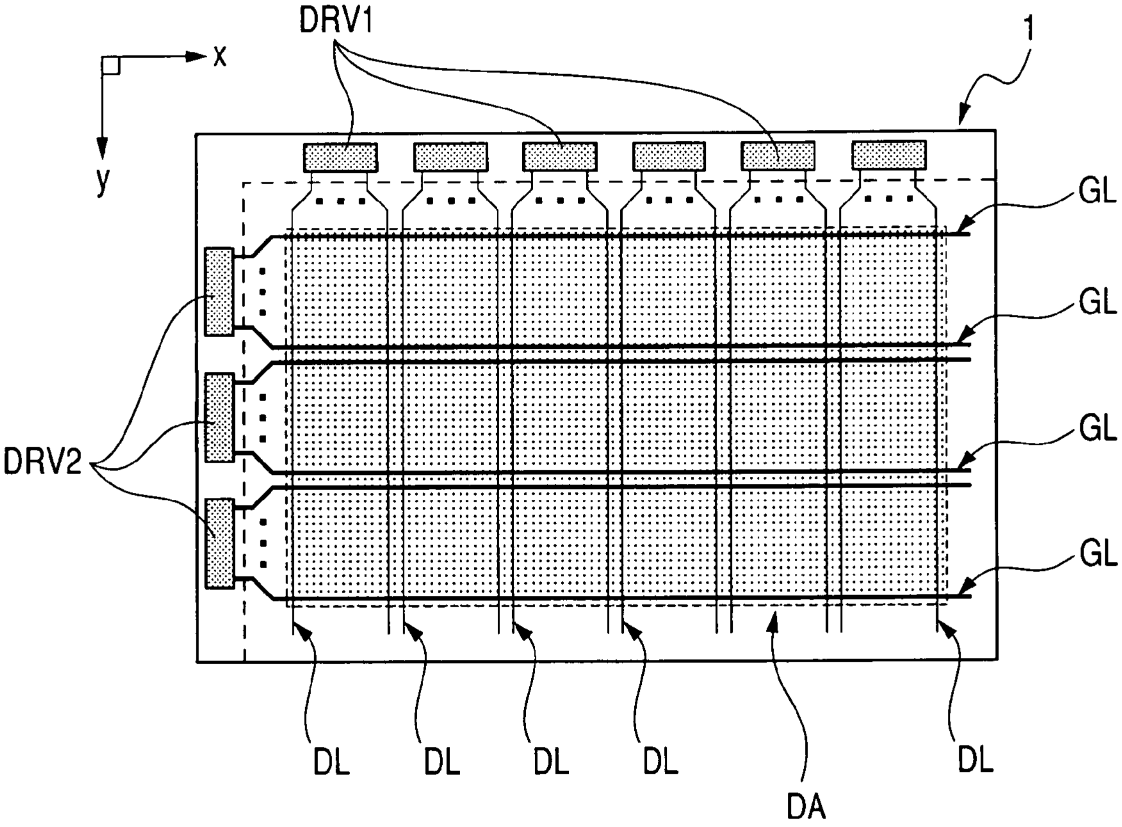
FIG. 2 is a schematic plan view showing the outlined constitution of a TFT substrate of the liquid crystal display panel shown in FIG. 1A and FIG. 1B.
Figure 3:
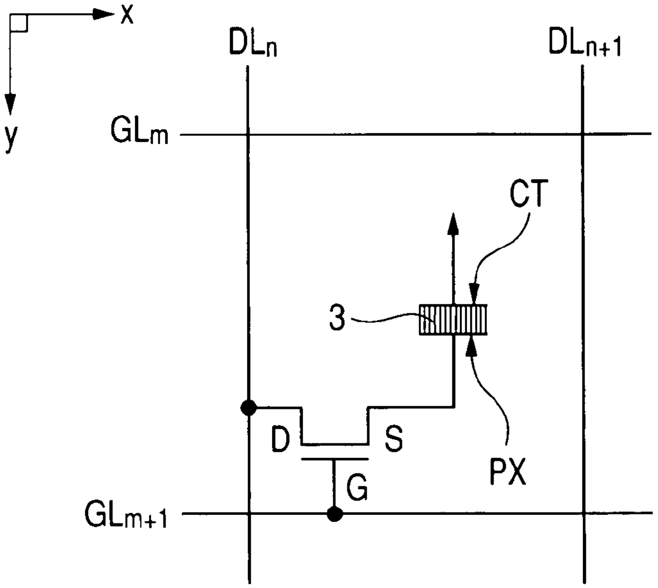
FIG. 3 is a schematic circuit diagram showing an example of a circuit constitution for one pixel in a display region of the TFT substrate shown in FIG. 2.

FIG. 1A is a schematic plan view showing an outlined constitution of a liquid display panel to which the invention is applied, FIG. 1B is a cross sectional view taken along line A-A' in FIG. 1A, FIG. 2 is a schematic plan view showing the outlined constitution of a TFT substrate of the liquid crystal display panel shown in FIG. 1A and FIG. 1B; FIG. 3 is a schematic circuit diagram showing an example of a circuit constitution for one pixel in a display region of the TFT substrate shown in FIG. 2.

The invention is applied, for example, to a manufacturing method of a substrate referred to as a TFT substrate used for an active matrix type liquid crystal display panel (hereinafter simply referred to as a liquid crystal display panel). For example, as shown in FIG. 1A and FIG. 1B, the liquid crystal display panel is a display panel, in which a liquid crystal material 3 is sealed between a pair of substrates i.e., a TFT substrate 1 and an opposed substrate 2. In this case, the TFT substrate 1 and the opposed substrate 2 are bonded with a sealing material 4 disposed so as to surround a display region DA constituted with an assembly of a plurality of pixels, and the liquid crystal material 3 is sealed in a space surrounded by the TFT substrate 1, the opposed substrate 2, and the sealing material 4. Further, polarization plates 5A, 5B are bonded to the outwarding surfaces of the TFT substrate 1 and the opposed substrate 2. Further, one or a plurality layers of phase difference plates may sometimes be disposed between the TFT substrate 1 and the polarization plate 5A, and between the opposed substrate 2 and the polarization plate 5B.

For example, as shown in FIG. 2, a plurality of scanning signal lines GL extending in the direction x that laterally transverse the display region DA, and a plurality of video signal lines DL that extend in the direction y and longitudinally traverse the display region DA are disposed to the TFT substrate 1 of the liquid crystal display panel. In this case, the circuit constitution of one pixel of the display region DA is, for example, as shown in FIG. 3, in which a region surrounded by two adjacent scanning signal line $GL_m$ and $GL_{m+1}$, and two adjacent video signal lines $DL_n$ and $DL_{n+1}$ corresponds to one pixel region. Further, a TFT device and a pixel electrode PX are disposed to each of the pixel. In the TFT device, the gate (G) is connected with one scanning signal line $GL_{m+1}$ of the two adjacent scanning signal lines, the drain (D) is connected with one video signal line $DL_n$ of the two adjacent video signal lines, and the source (S) is connected to the pixel electrode PX. The pixel electrode forms a pixel capacitance (also referred to sometimes as a liquid crystal capacitance) together with a common electrode CT disposed to the opposed substrate 2 or the TFT substrate 1 and the liquid crystal material 3.

Further, for example, as shown in FIG. 2, in the TFT substrate 1 applied with the invention, first driving circuits DRV1 for inputting a video signal to each of video signal lines DL and second driving circuits DRV2 for inputting a scanning signal to each of scanning signal lines GL are formed. The first driving circuit DRV1 is a circuit having a function equivalent with that of an existent data driver IC and has, for example, a circuit for generating a video signal (gradation data) to be input to each of the video signal lines DL, and a circuit for controlling the input timing. Further, the second driving circuit DRV2 is a circuit having a function equivalent with that of an existent scanning driver IC and has, for example, a circuit for controlling the timing of inputting the scanning signal to each of the scanning signal lines GL. Further, the first driving circuit DRV1 and the second driving circuit DRV2 in this case are, respectively, integrated circuits constituted with a combination of a plurality of semiconductor devices such as TFT devices or diodes.

Further, in the TFT substrate 1 to be applied with the invention, the first driving circuit DRV1 and the second driving circuits DRV2 are not IC chips but built-in circuits formed together with the scanning signal lines GL, the video signal lines DL, and the TFT devices in the display region DA on the TFT substrate 1. In this case, the first driving circuit DRV1 and the second driving circuit DRV2 are preferably formed to the inside of the sealing material 4, that is, between the sealing material 4 and the display region DA, but they may be formed also in a region overlapping with the sealing material 4 in view of a plane, or to the outside of the sealing material 4.

The present invention is applied to a manufacturing method of the TFT substrate 1 of a constitution, for example, as shown in FIG. 2 and FIG. 3, in which the semiconductor layer of the TFT device for each of the pixels in the display region DA is formed of a hydrogenated amorphous silicon (a-Si:H) and the semiconductor layer of the semiconductor devices of the first driving circuit DRV1 and the second driving circuit DRV2 are formed of a polycrystal silicon.

First Embodiment

FIG. 4A to FIG. 6 are schematic views for explaining the method of manufacturing a TFT substrate of a first embodiment according to the invention.

Figure 4A:
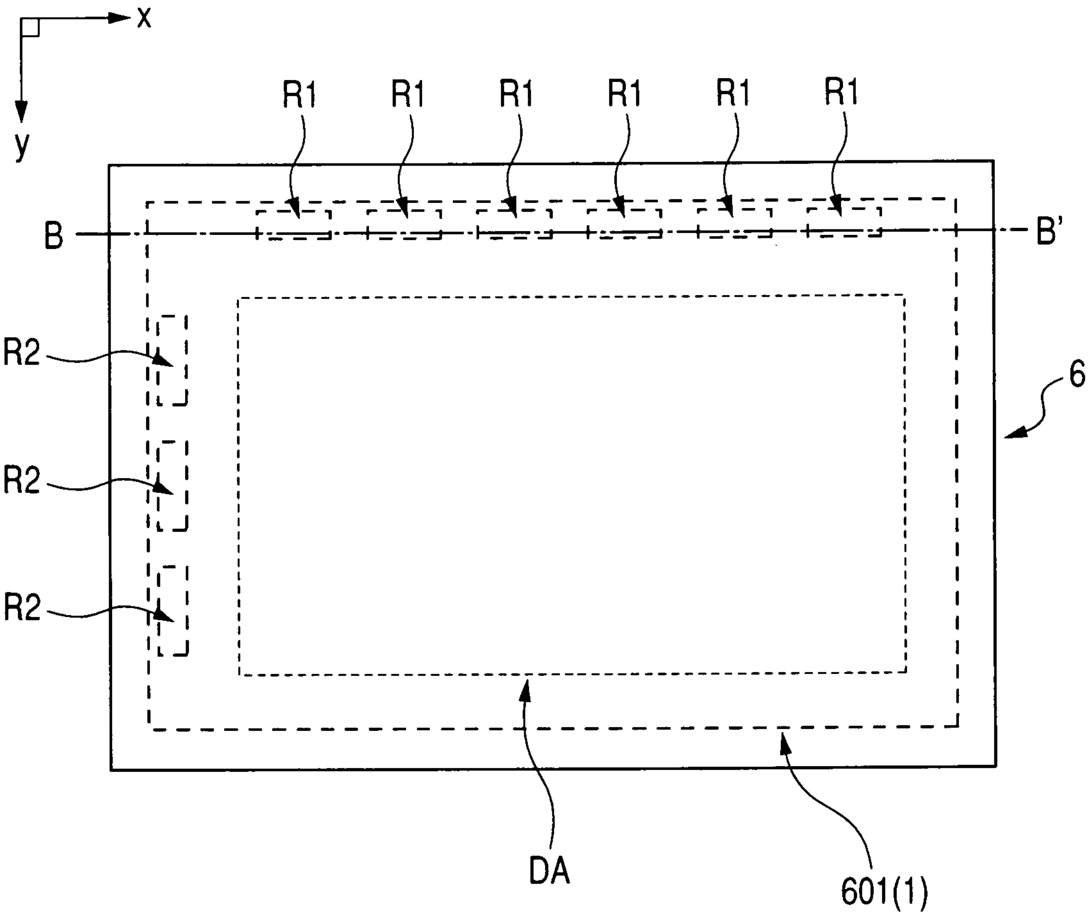
FIG. 4A is a schematic plan view of a mother glass just after depositing an amorphous silicon film.
Figure 4B:
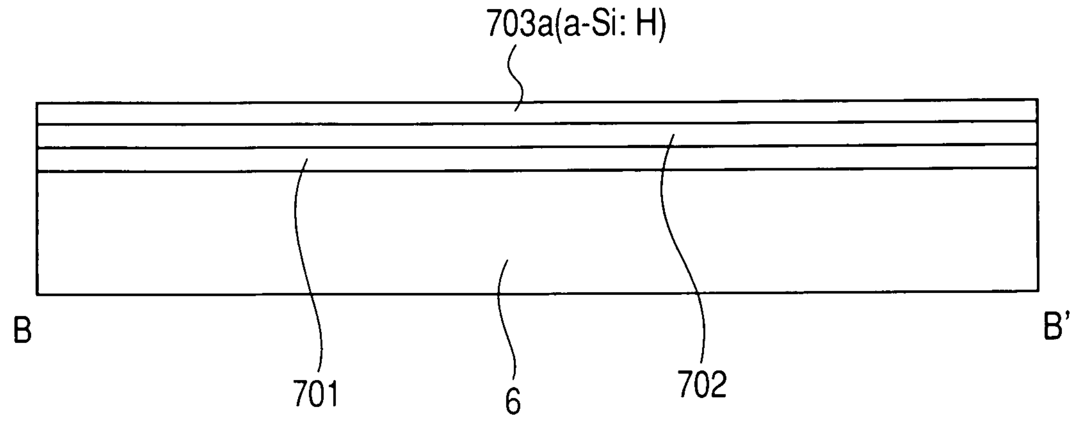
FIG. 4B is a schematic cross sectional view taken along line B-B' in FIG. 4A.
Figure 5A:
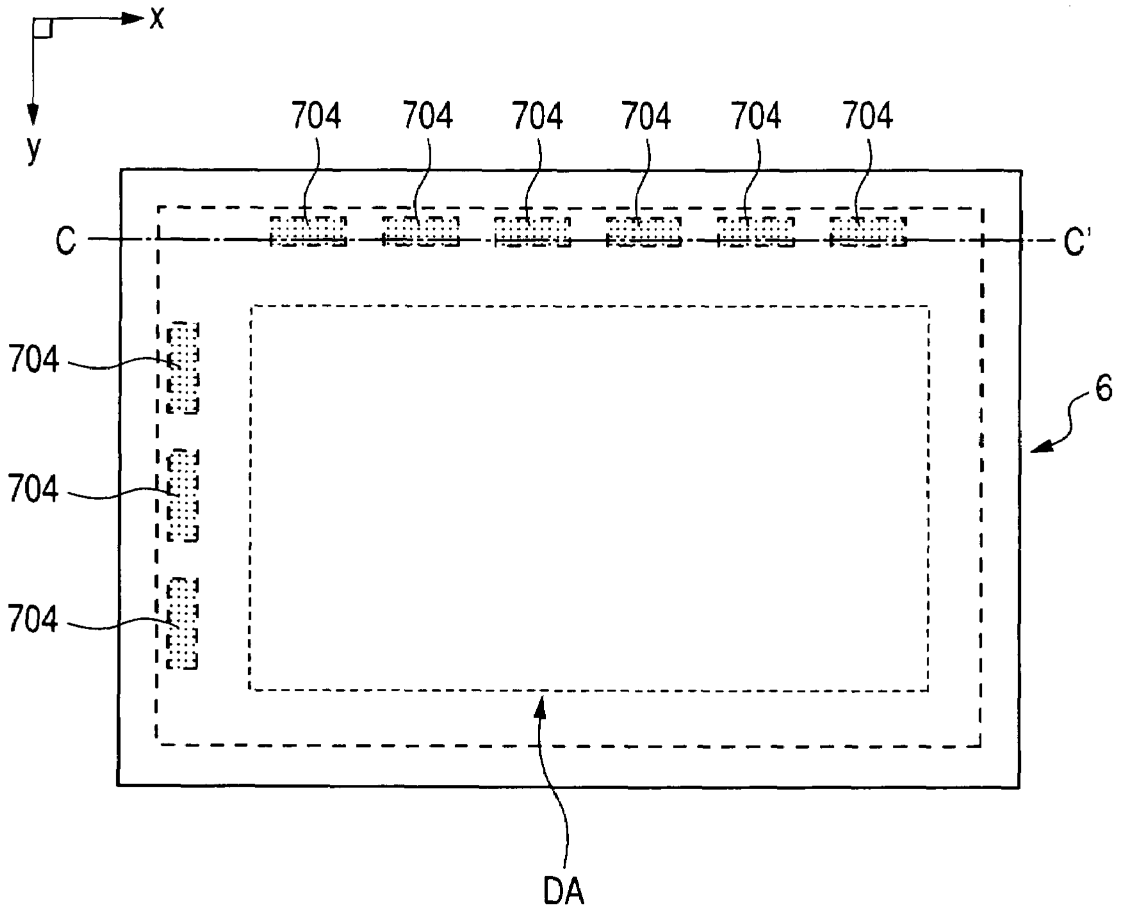
FIG. 5A is a schematic plan view of a mother glass just after polycrystallizing a portion of an amorphous silicon film.
Figure 5B:
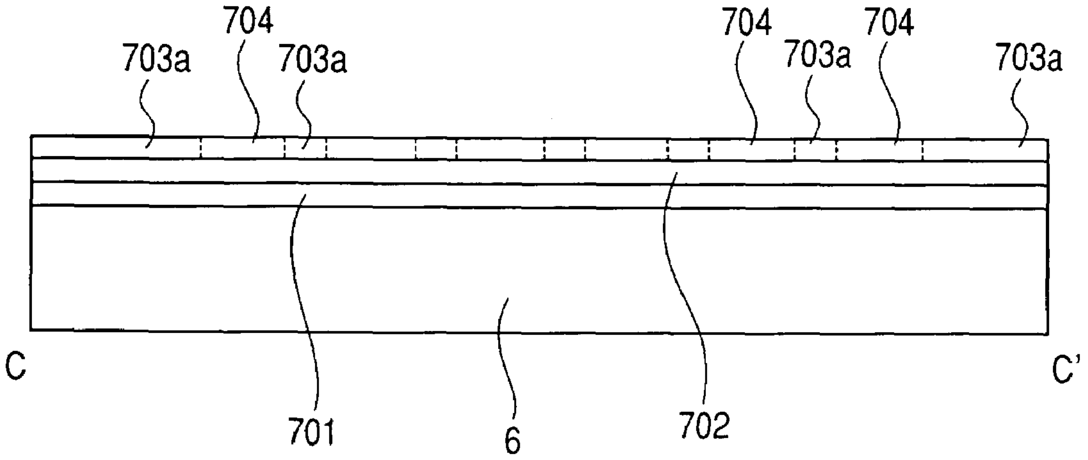
FIG. 5B is a schematic cross sectional view taken along line C-C' in FIG. 5A.
Figure 6:
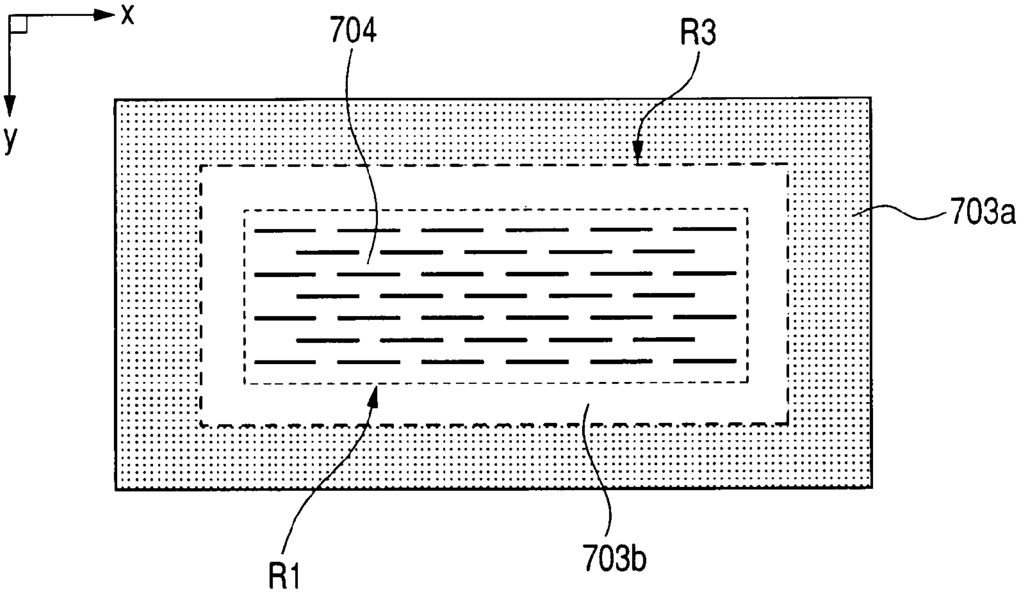
FIG. 6 is a schematic plan view showing, in an enlarged scale, a region formed into polycrystal silicon and a peripheral region thereof.

FIG. 4A is a schematic plan view of a mother glass just after depositing an amorphous silicon film. FIG. 4B is a schematic cross sectional view taken along line B-B' in FIG. 4A. FIG. 5A is a schematic plan view of the mother glass just after forming a portion of an amorphous silicon film into polycrystals. FIG. 5B is a schematic cross sectional view taken along line C-C' in FIG. 5A. FIG. 6 is a schematic plan view showing, in an enlarged scale, a polycrystallized silicon region and a peripheral region thereof.

In the first embodiment, description is to be made to the manufacturing step of the TFT substrate 1, for a step of forming an amorphous silicon film used as a semiconductor layer of a TFT device for each of pixels in the display region DA, and a polycrystal silicon film used as a semiconductor layer for semiconductor devices of the first driving circuits DRV1 and the second driving circuits DRV2.

The TFT substrate 1 is manufactured, for example, as shown in FIG. 4A, by using a glass substrate (hereinafter referred to as a mother glass) 6 having an area wider than the TFT substrate 1 when used in the liquid crystal display panel. The region 601 of the mother glass 6 corresponds to the TFT substrate 1 used in the liquid crystal display panel. A method of repeating film deposition and patterning by plural times to form scanning signal lines GL, video signal lines DL, TFT devices of the display region DA, pixel electrodes PX and the like to the region 601 and then cutting out the region 601 of the mother glass 6 as the TFT substrate 1 is adopted. In this case, the first driving circuit DRV1 is formed to the region R1 to the outside of the display region DA, and the second driving circuit DR2 is formed in the region R2 to the outside of the display region DA. One sheet of the mother glass 6 has a region to be cut out as the TFT substrate 1 in one, two, four and, further, ten and several portions.

In the manufacturing method of the first embodiment, the amorphous silicon film used as the semiconductor layer of the TFT device for each of the pixels in the display region DA, and the polycrystal silicon film used as the semiconductor layer for the semiconductor devices of the first driving circuit DRV1 and the second driving circuit DRV2 are formed by depositing an amorphous silicon film over the entire surface of the mother glass 6 and then polycrystallizing the amorphous silicon in the region R1 and the R2. For this purpose, as shown, for example, in FIG. 4A and FIG. 4B, a hydrogenated amorphous silicon film 703*a* is deposited at first above a silicon nitride film (SiN film) 701 and a silicon oxide film (SiO film) 702 laminated on the surface of the mother glass 6. The hydrogenated amorphous silicon film 703*a* is deposited, for example, by a plasma CVD method. Further, the hydrogenated amorphous silicon film 703*a* is deposited (formed) over the entire surface of the mother glass 6 and deposited not only in the display region DA but also in the region R1 for forming the first driving circuit and the region R2 for forming the second driving circuit.

Then, as shown, for example, in FIG. 5A and FIG. 5B, the hydrogenated amorphous silicon 703*a* in the region R1 for forming the first driving circuit and the region R2 for forming the second deriving circuit is formed into polycrystal silicon 704.

In the manufacturing method of the first embodiment, when the hydrogenated amorphous silicon 703*a* is formed into the polycrystal silicon 704, the first continuous oscillation laser is irradiated to dehydrogenate the amorphous silicon, and the second continuous oscillation laser is irradiated to once melt the dehydrogenated amorphous silicon, which is then cooled to form polycrystals. Further, in the manufacturing method of the first embodiment, when the amorphous silicon in the region R1 to form the first driving circuit is formed into the polycrystal silicon, the area of the region R3 to be dehydrogenated is made larger than the area of the region R1 for forming the polycrystal silicon 704, for example, as shown in FIG. 6. Therefore, in the manufacturing method of the first embodiment, just after polycrystallization of the amorphous silicon in the region R1 for forming the driving circuits, the region of the dehydrogenated amorphous silicon 703*b* remains to the outside of the region R1 in which the polycrystal silicon 704 was formed. An example of the procedure for forming the polycrystal silicon is to be described with reference to FIG. 7 to FIG. 9.

Figure 7:
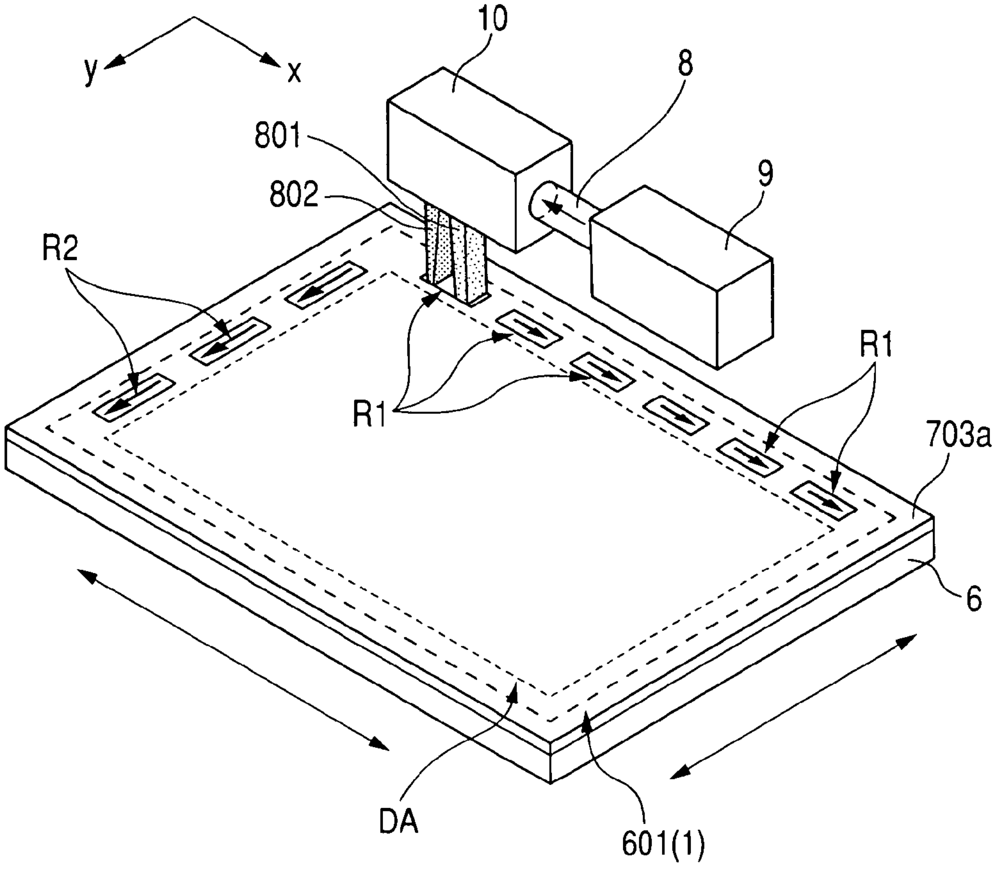
FIG. 7 is a schematic perspective view for explaining a method of irradiating a continuous oscillation laser in the manufacturing method of a first embodiment.
Figure 8:
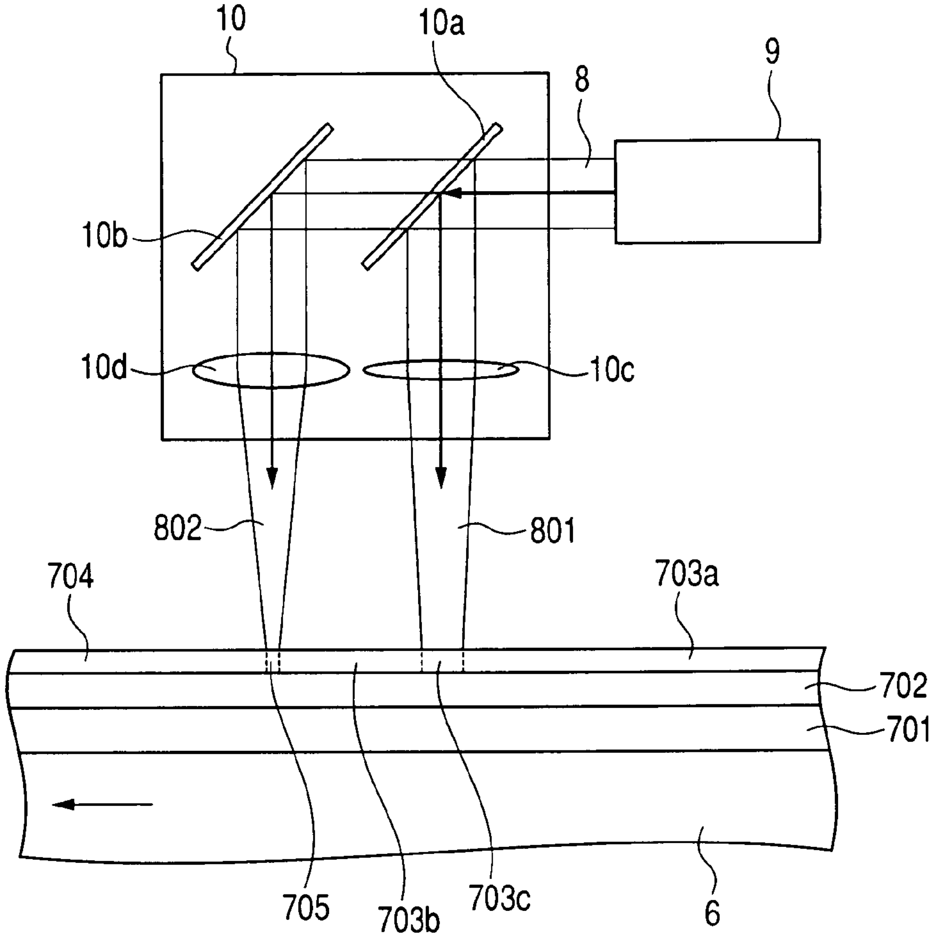
FIG. 8 is a schematic cross sectional view for the region irradiated with the continuous oscillation laser in FIG. 7 along a plane parallel with the direction x.
Figure 9:
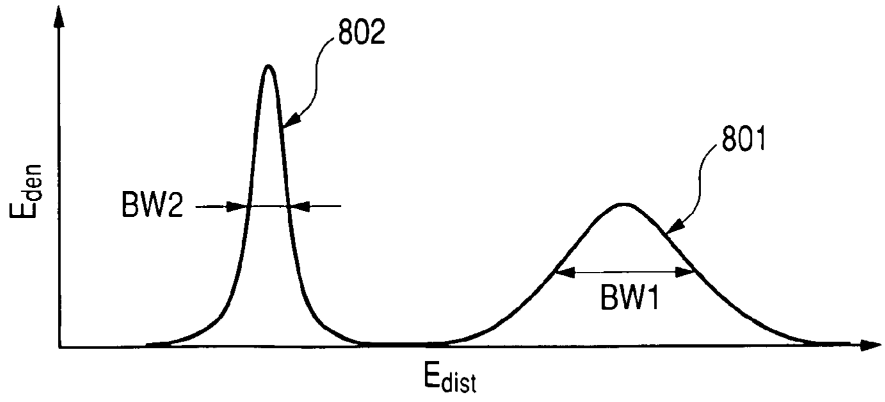
FIG. 9 is a schematic graph showing a relation between an energy distribution and an energy density of a continuous oscillation laser to be irradiated.

FIG. 7 to FIG. 9 are schematic views for explaining the step of polycrystallizing the amorphous silicon in the manufacturing steps of the TFT substrate in the first embodiment.

FIG. 7 is a schematic perspective view for explaining a method of irradiating a continuous oscillation laser in the manufacturing method of the first embodiment. FIG. 8 is a schematic cross sectional view for the region irradiated with the continuous oscillation laser in FIG. 7 along a plane parallel with the direction x, and FIG. 9 is a schematic graph showing a relation between the energy distribution and the energy density of the continuous oscillation laser to be irradiated.

The energy distribution of FIG. 9 is a distribution along a plane parallel to the scanning direction (moving direction) of the continuous oscillation laser.

In a case of forming the region R1 for forming the first driving circuit and the region R2 for forming the second driving circuit into polycrystal silicon in the hydrogenated amorphous silicon film 703*a*, a first continuous oscillation laser 801 for dehydrogenation is irradiated to each of the regions R1 and R2 for forming each of driving circuits and the peripheral region thereof by scanning while moving the mother glass 6 in the direction x or the direction y respectively and a second continuous oscillation laser 802 for melting the dehydrogenated amorphous silicon 703*b* is irradiated, successively, for example, as shown in FIG. 7. Upon scanning, either the mother glass 6 may be moved or the optical system for irradiating the continuous oscillation lasers 801 and 802 may be moved. Further, both the mother glass 6 and the optical system may be moved.

The first continuous oscillation laser 801 and the second continuous oscillation laser 802 are irradiated, for example, in the form of two beams (continuous oscillation lasers) 801 and 802 formed by an optical system 10 from a continuous oscillation laser 8 generated by a laser oscillator 9. The optical system 10 is provided, for example, with a half mirror 10*a*, a total reflection mirror 10*b*, a first lens 10*c*, and a second lens 10*b*. Then, in the continuous oscillation laser 8 generated by the laser oscillator 9, the beam reflected at the half mirror 10*a* is formed as the first continuous oscillation laser 801 and irradiated to the amorphous silicon film 703*a* with the focal point being adjusted by the first lens 10*c*. In this case, in the amorphous silicon film 703*c* of the region irradiated with the first continuous oscillation laser 801, hydrogen is evaporated by the heat generated under irradiation and the content is decreased gradually.

Further, in the continuous oscillation laser 8 generated by the laser oscillator 9, the beam transmitting the half mirror 10*a* is formed as the second continuous oscillation laser 802 and, after changing the optical channel by the total reflection mirror 10*b* and irradiated to the dehydrogenated amorphous silicon 703*b* with the focal point being adjusted by the second lens 10*d*. In this case, the silicon 705 in the region irradiated with the second continuous oscillation laser 802 is in a molten state and crystallized into polycrystal silicon 704 as the mother glass 6 (or the second continuous oscillation laser 802) moves.

Although not illustrated in FIG. 8, the optical system 10 is provided, for example, with a shutter or a modulating device for controlling the irradiation and shutting (not irradiation) of the first continuous oscillation laser 801 and the second continuous oscillation laser 802. Then, in a case of conducting scanning, for example, by moving the mother glass 6 by opening and closing the shutter based on the positional relation between the mother glass 6 and the optical system 10, the amorphous silicon 703*a* in the plurality of regions R1 arranged in the direction x can be polycrystallized by scanning for once.

By the way, the first continuous oscillation laser 801 is a beam irradiated for dehydrogenating the amorphous silicon 703*a*. Accordingly, it is necessary to irradiate the beam at a power lower than that of the second continuous oscillation laser 802 for melting the dehydrogenated amorphous silicon 703*b*. Further, for decreasing the amount of hydrogen contained in the dehydrogenated amorphous silicon 703*b* as close as to 0, it is necessary to irradiate the laser for a time as long as possible. Accordingly, upon forming the first continuous oscillation laser 801 and the second continuous oscillation laser 802 in the optical system 10, the relation between the energy distribution and the energy density of the respective continuous oscillation lasers 801 and 802 are in the relation, for example, as shown in FIG. 9. In the graph of FIG. 9, the abscissa expresses the energy distribution $E_{dist}$ for each of the continuous oscillation lasers 801 and 802, and the ordinate expresses the energy density $E_{den}$ for each of the continuous oscillation lasers 801 and 802.

That is, in the first continuous oscillation laser 801 used for dehydrogenation, the energy density $E_{den}$ is made lower than the energy density of the second continuous oscillation laser 802, and the energy distribution $E_{dist}$ (beam width BW1) in the scanning direction (moving direction) is made larger than the energy distribution of the second continuous oscillation laser 802 (beam width BW2). The beam width BM1 or BM2 is a size measured for each of the continuous oscillation lasers along the scanning direction. Such two continuous oscillation lasers 801 and 802 different in the energy distribution $E_{dist}$ and the energy density $E_{den}$ as described above may be obtained, for example, by controlling the transmittance and the reflectance of the half mirror 10*a* and the diffractive index and the focal point, etc. of the first lens 10*c* and the second lens 10*d* of the optical system.

Figure 10:
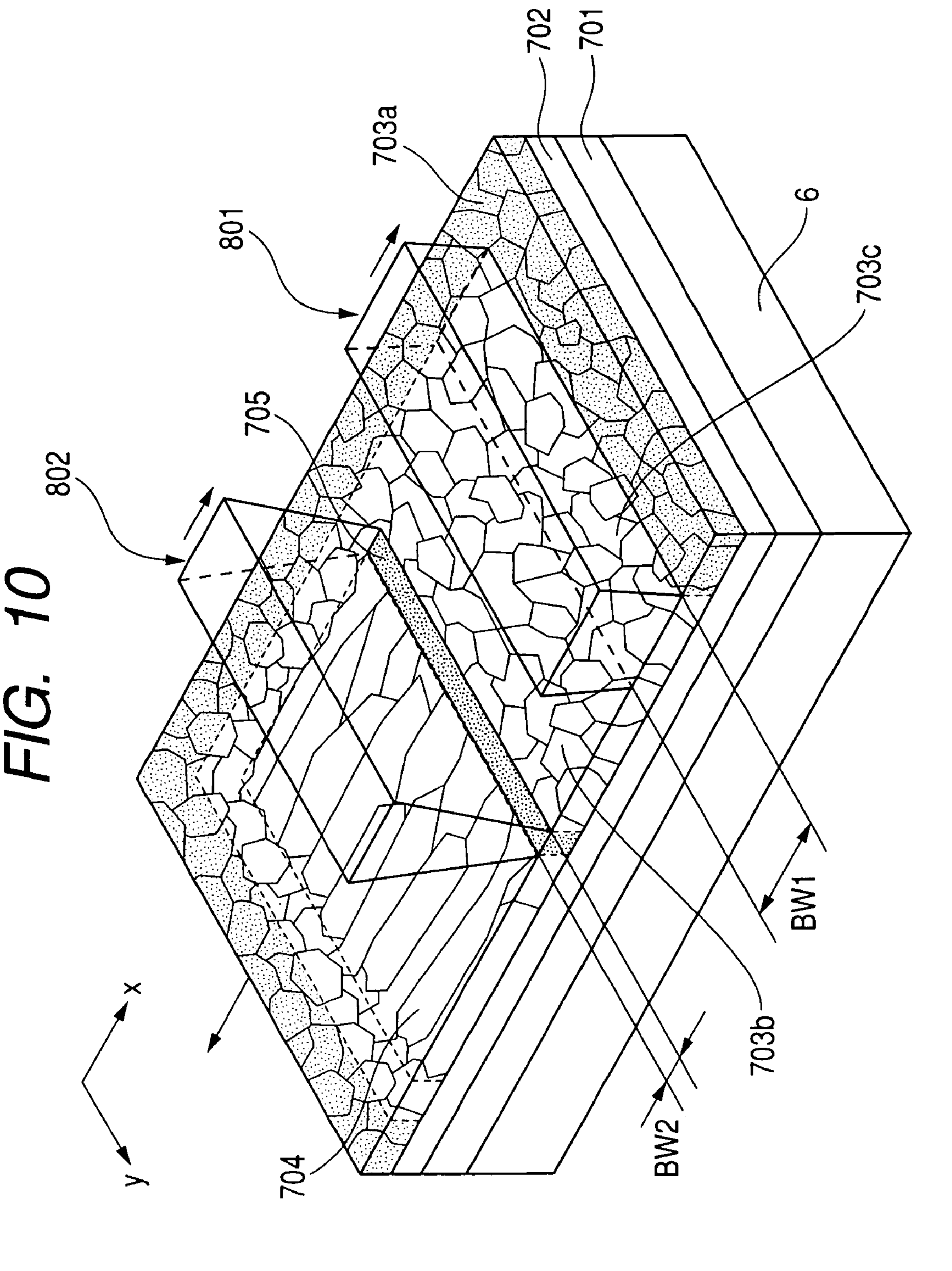
FIG. 10 is a schematic view for explaining the function and the effect of a method of manufacturing a TFT substrate according to the first embodiment.

FIG. 10 is a schematic view for explaining the function and the effect of the manufacturing method of the TFT substrate of the first embodiment.

In the manufacturing method of the first embodiment, as shown, for example, in FIG. 10, the amorphous silicon 703*b* dehydrogenated by irradiation of the first continuous oscillation laser 801 is melted by irradiation of the second continuous oscillation laser 802. Since the first continuous oscillation laser 801 and the second continuous oscillation laser 802 are irradiated, for example, by moving the mother glass 6 in the direction −x, the region melted by irradiation of the second continuous oscillation laser 802 moves in the direction +x. In this case, the molten silicon 705 is crystallized by lowering of the temperature when the second continuous oscillation laser 802 moves and is no more irradiated. Further, the molten silicon 705 is crystallized so as to grow nuclei formed upon crystallization of silicon melted at the position of starting the irradiation of the second continuous oscillation laser 802. Accordingly, in the region irradiated by the second continuous oscillation laser 802, a number of strip-like crystals extending lengthwise substantially along the moving direction (direction x) of the second continuous oscillation laser 802 are formed (pseudo single crystals).

In this case, when the area of the region R3 for irradiating the first continuous oscillation laser 801 to dehydrogenate the amorphous silicon is made larger than the region R1 for irradiating the second continuous oscillation laser, a region of the dehydrogenated amorphous silicon 703*b* is present between the molten region formed by the irradiation of the second continuous oscillation laser 802 and the region where the hydrogenated amorphous silicon 703*a* remains as it is, as shown in FIG. 10. Accordingly, this can prevent bumping of the amorphous silicon 703*a* hydrogenated by the heat of the irradiated second continuous oscillation laser 802 to thereby prevent degradation of the quality of the polycrystal silicon 704 at the outer periphery of the polycrystallized silicon region R1. In this case, the size of the first continuous oscillation laser 801 in the longitudinal axis is preferably larger than the size of the second continuous oscillation laser 802 in the longitudinal axis.

As described above, in a case of irradiating the first continuous oscillation laser 801 and the second continuous oscillation laser 802 to each of the regions R1 forming the first driving circuits while moving the mother glass 6 in the direction −x, a polycrystal silicon 704 comprising an assembly of strip-like crystals extending lengthwise in the direction shown by an arrow (direction x) in FIG. 7 is formed in each of the regions R1 forming the first driving circuits. Accordingly, in a case of forming the TFT device to the region R1 for forming the first driving circuits, when the source electrode and the drain electrode are formed such that the direction of the channel length (moving direction of carriers) is in the direction x, the carrier mobility is increased and the operating speed of the TFT device can be made higher.

Further, although detailed descriptions are omitted, each of the regions R2 for forming the second driving circuits can be formed into polycrystal silicon, for example, by irradiating the first continuous oscillation laser 801 and the second continuous oscillation laser 802 to each of the regions R2 for forming the second driving circuit by rotating the mother glass 6 by 90 degree such that the direction y shown in FIG. 7 turns to the direction x and moving the mother glass 6 in the direction −y. Then, in each region R2 for forming the second driving circuit, a polycrystal silicon 704 comprising the assembly of strip-like crystals extending lengthwise in the direction shown by the arrow in FIG. 7 (direction y) is formed. Accordingly, in a case of forming a TFT device in the region R2 for forming the second driving circuits, when the source electrode and the drain electrode are formed such that the longitudinal direction of the channel is in the direction y, the carrier mobility is enhanced and the operating speed of the TFT device can be made higher.

In the first embodiment, for the manufacturing steps of the TFT substrate 1, description has been made only to the step of forming the amorphous silicon film 703*a* used as the semiconductor layer for the TFT device for each of pixels in the display region DA and the polycrystal silicon film 704 used as the semiconductor layer for the semiconductor devices of the first driving circuits DRV 1 and the second driving circuits DRV2. In this case, other steps in the manufacturing step for the TFT substrate 1, for example, a step of forming scanning signals lines GL, a step of forming video signal lines DL, a step of forming pixel electrodes PX, etc. may be conducted by the same procedures as existent manufacturing procedures for the TFT substrate 1. Further, in this case, the order for each of the steps, the constitution for the TFT device of the display region DA, and the constitution for the semiconductor devices of the first driving circuits DRV1 and the second driving circuits DRV2 are optional and may be selected properly from the order and the constitution applied in the existent TFT substrates.

Further, in the TFT substrate 1 manufactured by the application of the manufacturing method according to the first embodiment, the semiconductor layer of the TFT device for each of the pixels in the display region DA is the amorphous silicon 703*a*. Accordingly, the TFT device in the display region DA is preferably formed as a TFT device in which a gate electrode is disposed between a glass substrate (mother glass 6) and a semiconductor layer (amorphous silicon 703*a*) (bottom gate type TFT device). However, it will be apparent that the TFT device in the display region DA is not restricted thereto but may also be a TFT device in which a gate electrode is disposed to a layer above the semiconductor layer (amorphous silicon 703*a*) as viewed from the glass substrate (mother glass 6) (top gate type TFT device).

Further, in a case of forming the TFT device in the display region DA as the bottom gate type TFT device, for example, in a case where the TFT devices of the first driving circuit DRV1 and the second driving circuit DRV2 are also formed as the bottom gate type, the gate electrodes of the TFT devices in the display region DA and the TFT devices of the first driving circuit DRV1 and the second driving circuit DRV2 can be formed in one step.

However, in a case of forming the TFT devices for the first driving circuit DRV1 and the second driving circuit DRV2 as the bottom gate type, since the gate electrode is present below the amorphous silicon film 703*a* upon forming the polycrystal silicon as the semiconductor layer, unevenness is caused to the amorphous silicon film 703*a*, resulting in, for example, in-plane variation of crystallization due to unevenness of the heat conductivity. Accordingly, in a case of forming the TFT devices for the first driving circuit DRV1 and the second driving circuit DRV2 into the top gate type TFT device, the in-plane variation of crystallization less occurs making it possible to suppress the occurrence of variation in the characteristics between each of TFT devices.

Figure 11:
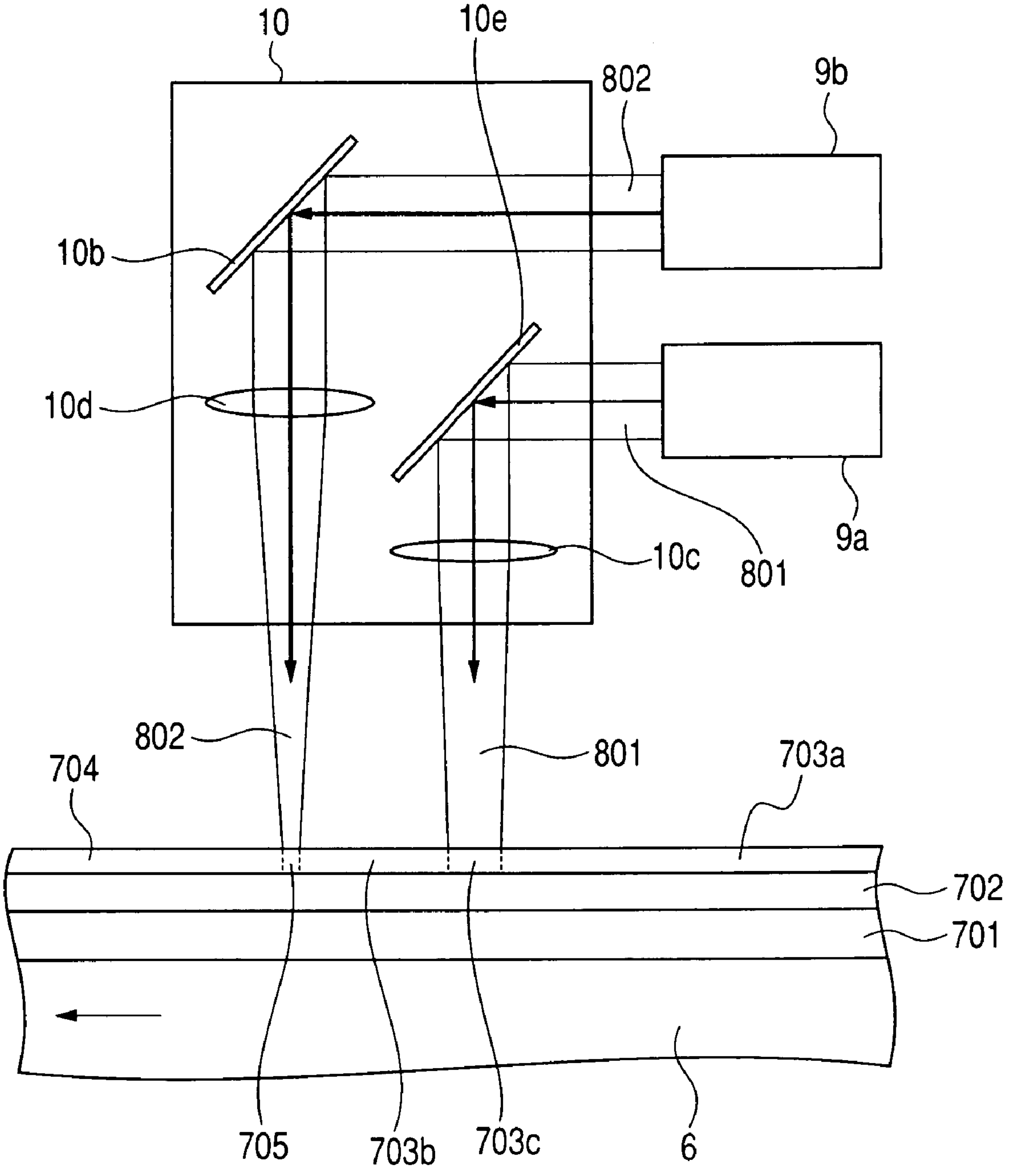
FIG. 11 is a schematic view for explaining a modified example of a method of forming a continuous oscillation laser in the manufacturing method according to the first embodiment.

FIG. 11 is a schematic view for explaining a modified example of a method of forming continuous oscillation laser in the manufacturing method of the first embodiment.

In the manufacturing method of the TFT substrate 1 according to the first embodiment, in a case of constituting the optical system 10 that forms the first continuous oscillation laser 801 and the second continuous oscillation laser 802, for example, as shown in FIG. 8, two continuous oscillation lasers 801 and 802 can be formed from one laser oscillator 9. However, the manufacturing method of the first embodiment is not restricted only thereto. For example, as shown in FIG. 11, two laser oscillators 9*a*, 9*b* may be used to generate a first continuous oscillation laser 801 for dehydrogenating amorphous silicon by the first oscillator 9*a* and generate a second continuous oscillation laser 802 for melting the dehydrogenated amorphous silicon by the second oscillator 9*b*. In this case, the first continuous oscillation laser 801 is changed for the optical channel, for example, by a first total reflection mirror 10*e* and irradiated through the first lens 10*c* to the amorphous silicon film 703*a*. For example, the second continuous oscillation laser 802 is changed for the optical channel by the second total reflection mirror 10*b* and irradiated by way of the second lens 10*d* to the dehydrogenated amorphous silicon 703*b*. Further in this case, the beam width in the moving direction of the first continuous oscillation laser 801 and the second continuous oscillation laser 802 may be defined, for example, by adjusting the refractive index and the focal point of the first lens 10*c* and the second lens 10*d*.

Figure 12:
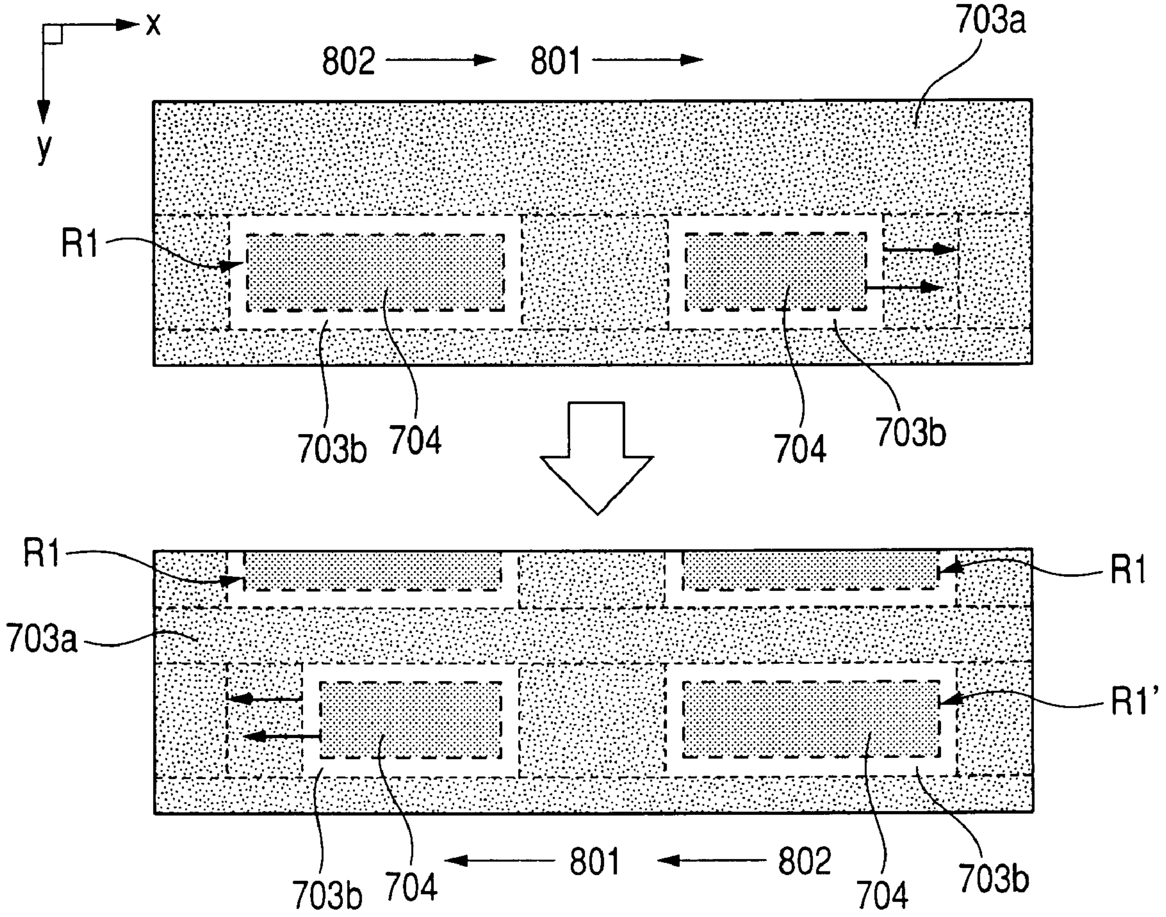
FIG. 12 is a schematic view for explaining a first modified example of a method of forming a polycrystal silicon in a manufacturing method of a TFT substrate according to the first embodiment.
Figure 13:
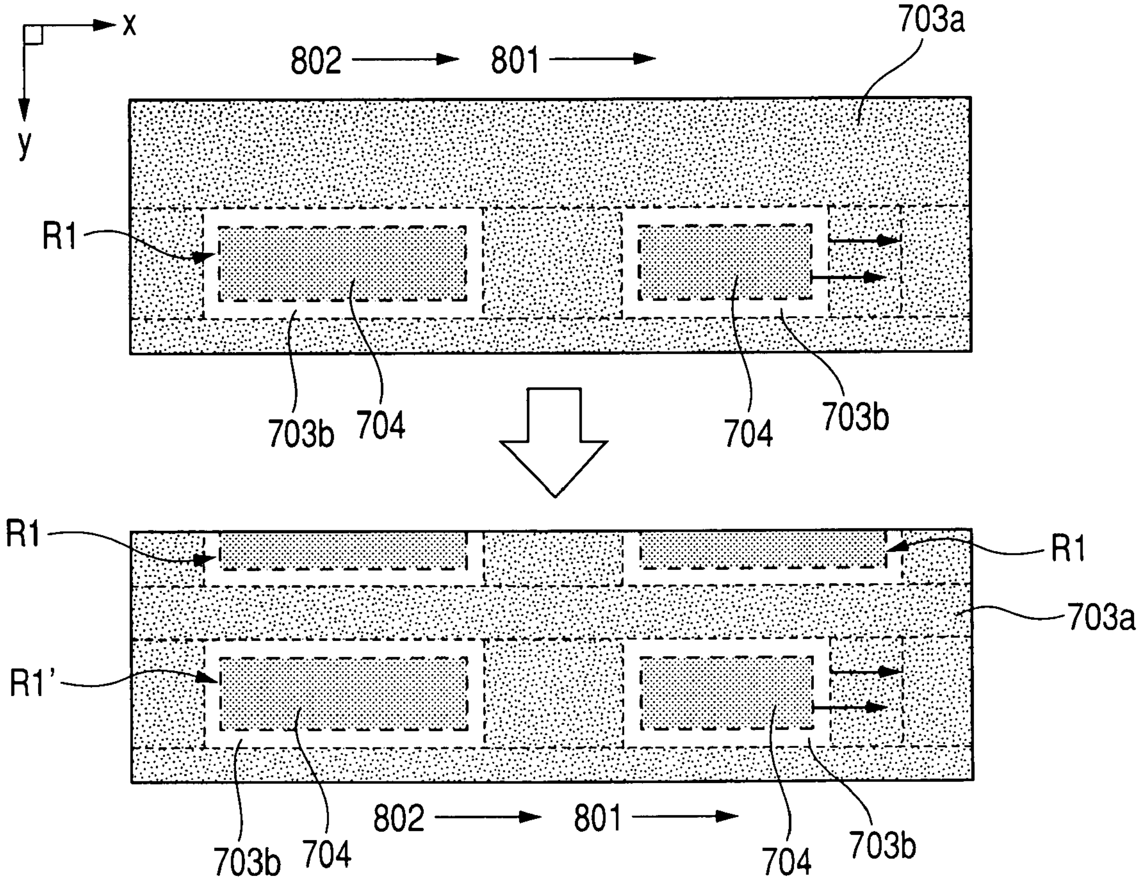
FIG. 13 is a schematic view for explaining a second modified example of a method of forming a polycrystal silicon in a manufacturing method of a TFT substrate according to the first embodiment.
Figure 14:
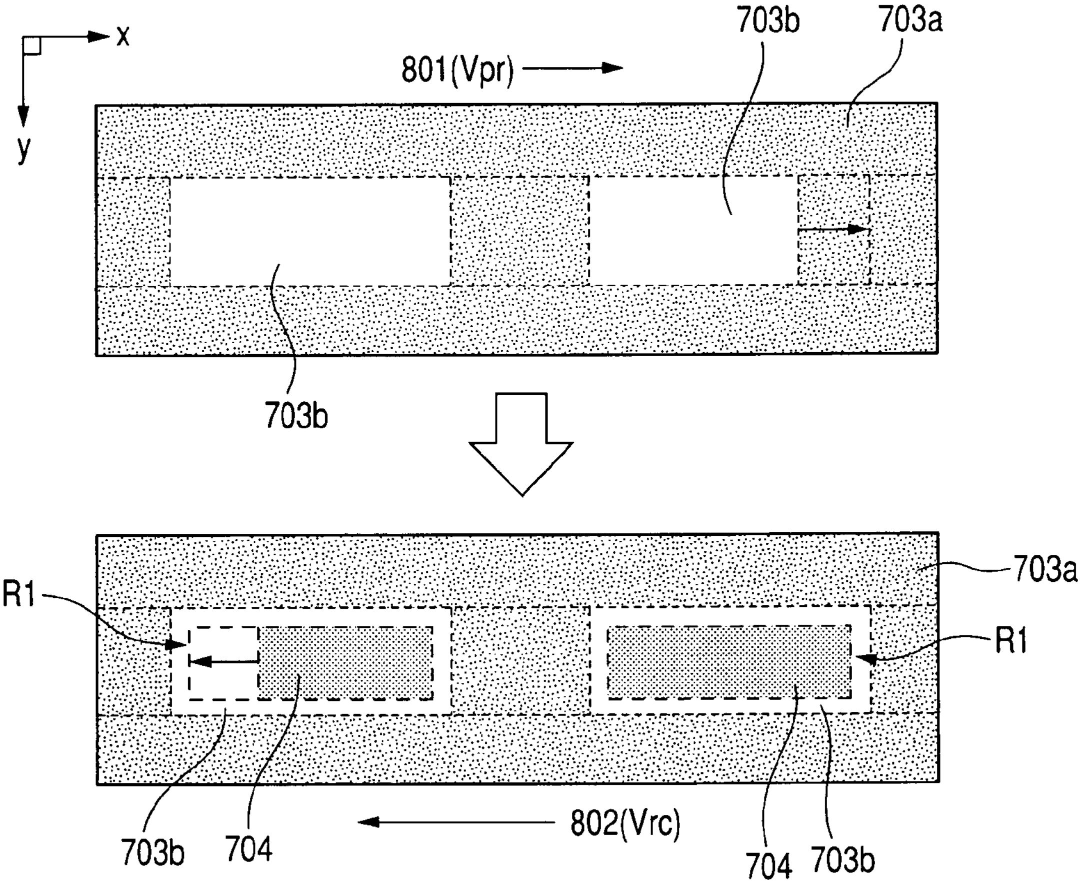
FIG. 14 is a schematic view for explaining a third modified example of a method of forming a polycrystal silicon in a manufacturing method of a TFT substrate according to the first embodiment.

FIG. 12 is a schematic view for explaining a first modified example of a method of forming a polycrystal silicon in a manufacturing method of a TFT substrate according to the first embodiment. FIG. 13 is a schematic view for explaining a second modified example of a method of forming a polycrystal silicon in a manufacturing method of a TFT substrate according to the first embodiment. FIG. 14 is a schematic view for explaining a third modified example of a method of forming a polycrystal silicon in a manufacturing method of a TFT substrate 1 according to the first embodiment.

As the procedure for dehydrogenating and polycrystallizing the amorphous silicon film 703*a*, the example shown in FIG. 7 and FIG. 8 show only the case of scanning a strip-like region on the mother glass 6 in one direction (direction +x). In this case, all the regions R1 for forming the first driving circuits can sometimes be formed into the polycrystal silicon by scanning the strip-like region only for once. However, regions R1 and R1' for forming two first driving circuits are sometimes arranged in the direction y. In this case, as shown, for example, in the upper part of FIG. 12, the polycrystal silicon 704 can be formed efficiently to each of the region R1 and R1', by irradiating the first continuous oscillation laser 801 and the second continuous oscillation laser 802 while scanning the strip-like region containing the region R1 for forming one driving circuit in the direction +x to form a polycrystal silicon 704, then moving the mother glass 6 in the direction y, and irradiating the first continuous oscillation laser 801 and the second continuous oscillation laser 802 while scanning the strip-like region containing the region R1' for forming the other driving circuit in the direction −x as shown in the lower part of FIG. 12, to form the polycrystal silicon 704.

It will be apparent that the scanning method is not restricted to that shown in FIG. 12 but the polycrystal silicon 704 may also be formed as shown, for example, in FIG. 13 by irradiating a first continuous oscillation laser 801 and a second continuous oscillation laser 802 while scanning a strip-like region containing a region R1 for forming one driving circuit in the direction +x, thereby forming a polycrystal silicon 704, then returning the positional relation between the mother glass 6 and the optical system to that before scanning, moving the mother glass in the direction y and irradiating the first continuous oscillation laser 801 and the second continuous oscillation laser 802 while scanning the strip-like region containing the region R1' for forming other driving circuit again in the direction +x.

Further, in the first embodiment, the first continuous oscillation laser 801 and the second continuous oscillation laser 802 are moved in one identical direction and the dehydrogenated amorphous silicon 703*b* is successively melted to form the polycrystal silicon 704. However, this is not restrictive and the polycrystal silicon may also be formed as shown, for example, in the upper part of FIG. 14, by irradiating only the first continuous oscillation laser 801 in a case of scanning in the direction +x to form the dehydrogenated amorphous silicon 703*b*, then the direction is turned while fixing the position in the direction y as it is and only the second continuous oscillation laser 802 is irradiated upon scanning in the direction −x as shown in the lower part of FIG. 14 thereby melting the dehydrogenated amorphous silicon 703*b*. Further, while not illustrated in the drawing, it will be apparent that as shown in the upper part of FIG. 14, the polycrystal silicone 704 may be formed by scanning in the direction +x thereby forming the dehydrogenated amorphous silicon 703*b*, then returning the mother glass 6 to the position before scanning and then conducting scanning again in the direction +x.

As described above, in a case of conducting dehydrogenation by the first scanning and forming the polycrystal silicon by the second scanning, the moving speed (scanning speed) of the first continuous oscillation laser 801 upon dehydrogenation and the moving speed (scanning speed) of the second continuous oscillation laser 802 upon forming polycrystal silicon can be set independently. Accordingly, in a case of setting the speed Vpr upon dehydrogenation to lower than the speed Vrc upon forming the polycrystal silicon, it is possible to make the time longer for the irradiation of the first continuous oscillation laser 801 at each of the points of the regions R3 to be dehydrogenated upon dehydrogenation and the amount of hydrogen remaining in the dehydrogenated amorphous silicon 703*b* can be approached to 0 as much as possible.

Further, in the first embodiment, description has been made to a method of forming the dehydrogenated amorphous silicon film 703*b* successively into the polycrystal silicon while considering the dehydrogenation for the amorphous silicon 703*a* and the polycrystallization of the dehydrogenated amorphous silicon 703*b* as one identical step. However, it will be apparent that the manufacturing method of the first embodiment is not restricted only thereto but, for example, the dehydrogenating step and the step of forming polycrystal silicon may be divided into two steps. In this case, the step for dehydrogenating the amorphous silicon 703*a* is preferably conducted in an oxygen atmosphere.

Second Embodiment

Figure 15:
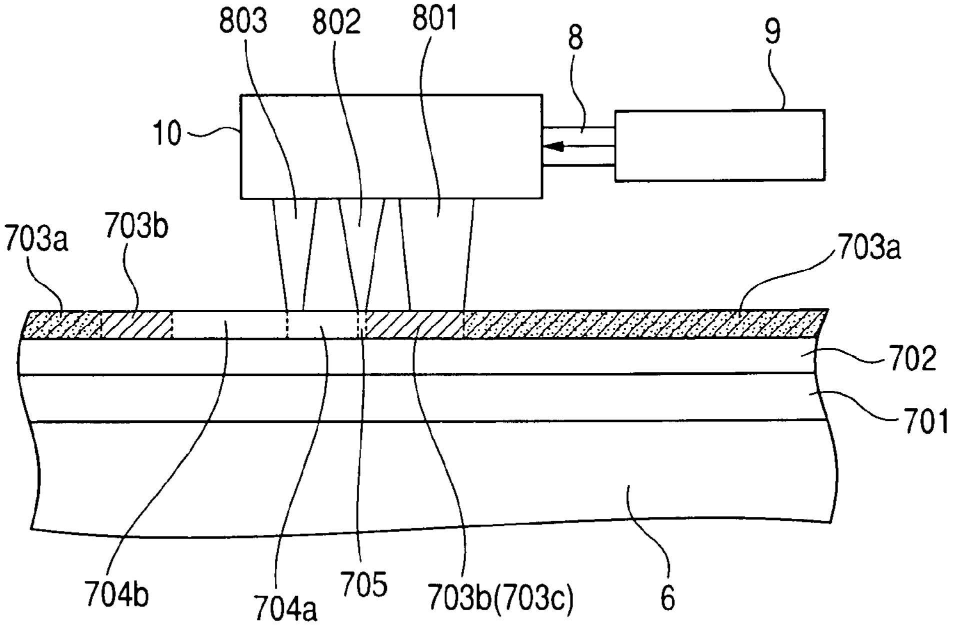
FIG. 15 is a schematic cross sectional view for explaining a method of irradiating a continuous oscillation laser in the manufacturing method of a second embodiment.
Figure 16:
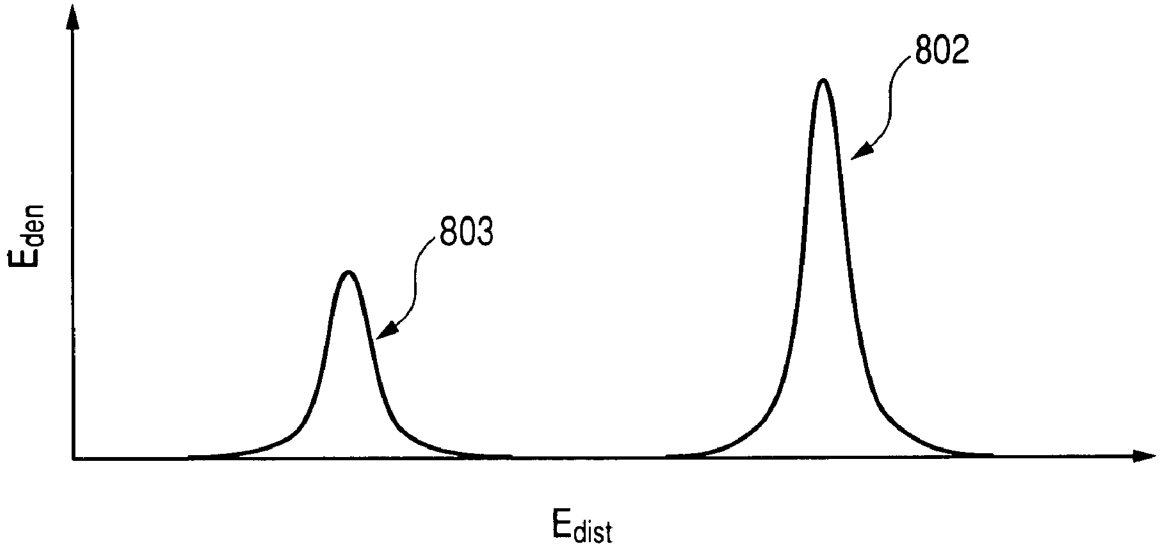
FIG. 16 is a schematic graph showing a relation between an energy distribution and an energy density of a continuous oscillation laser to be irradiated.

FIG. 15 and FIG. 16 are schematic views for explaining the manufacturing method of a TFT substrate according to the second embodiment of the invention.

FIG. 15 is a schematic cross sectional view for explaining a method of irradiating a continuous oscillation laser in the manufacturing method of the second embodiment. FIG. 16 is a schematic graph showing a relation between the energy distribution and the energy density of the irradiated continuous oscillation laser. FIG. 16 shows a relation between the energy distribution and the energy density for the second continuous oscillation laser for melting the dehydrogenated amorphous silicon and the third continuous oscillation laser irradiated to the polycrystallized silicon region, in which the abscissa expresses the energy distribution $E_{dist}$ and the ordinate expresses the energy density $E_{den}$. Further, the energy distribution $E_{dist}$ in FIG. 16 is a distribution along a plane parallel to the scanning direction (moving direction) of the continuous oscillation laser.

In the second embodiment, a method of stabilizing the shape of each of crystals constituting the formed polycrystal silicon and decreasing the crystal grain boundaries is to be described on the premise of a method of polycrystallizing the amorphous silicon as described in the first embodiment.

In a case of polycrystallizing the amorphous silicon as described, for example, in the first embodiment, the amorphous silicon 703*a* is dehydrogenated by irradiation of the first continuous oscillation laser 801 and then the dehydrogenated amorphous silicon 703*b* is melted once by irradiation of the second continuous oscillation laser 802 and formed into the polycrystal silicon in the course of cooling the molten silicon 705. However, in a case of polycrystallizing the silicon by the method as in the first embodiment, since the change (lowering) of temperature upon crystallization is abrupt, for example, this tends to increase the variation for the shape of each of the crystals constituting the polycrystal silicon or decrease the size of each of the crystals to increase the crystal grain boundaries. Accordingly, this may sometimes vary the characteristics for each of the TFT devices upon forming the TFT devices having the polycrystal silicon as the semiconductor layer.

The present inventors have found that the variation for the shape of each of the crystals constituting the polycrystal silicon can be suppressed and the crystal grain boundaries can be decreased, for example, by irradiating the third continuous oscillation laser 803 to the polycrystal silicon 704*a* formed by crystallization of silicon 705 melted by the irradiation of the second continuous oscillation laser 802 thereby conducting post-annealing, as shown in FIG. 15.

In this case, the first continuous oscillation laser 801 for dehydrogenating the amorphous silicon 703*a*, the second continuous oscillation laser 802 for melting the dehydrogenated amorphous silicon 703*b*, and the third continuous oscillation laser 803 for moderating abrupt temperature lowering of the polycrystal silicon 704*a* upon crystallization of the molten silicon 705 may be irradiated, for example, as shown in FIG. 15, by irradiating a continuous oscillation laser 8 generated from one laser oscillator 9 in the form of three continuous oscillation lasers (beams) by an optical system 10. Although not illustrated, the optical system 10 may be provided, for example, with two half mirrors to divide one continuous oscillation laser 8 into three beams and they may be irradiated to the mother glass 6 while adjusting the refractive indexes and the focal points of the lenses thereby adjusting the width in the scanning direction (moving direction) of each of the continuous oscillation lasers 801, 802, and 803.

In this case, the third continuous oscillation laser 803 is a laser irradiated for moderating the abrupt temperature lowering of the polycrystal silicon 704*a* upon crystallization of the molten silicon 705. Accordingly, the energy density $E_{den}$ (power) of the third continuous oscillation laser 803 is made lower than the energy density of the second continuous oscillation laser 802 as shown, for example, in FIG. 16. Further, while not illustrated in FIG. 16, the relation between the energy distribution $E_{dist}$ and the energy density $E_{den}$ of the first continuous oscillation laser 801 and the second continuous oscillation laser 802 is defined in such a relation as shown in FIG. 9.

Figure 17:
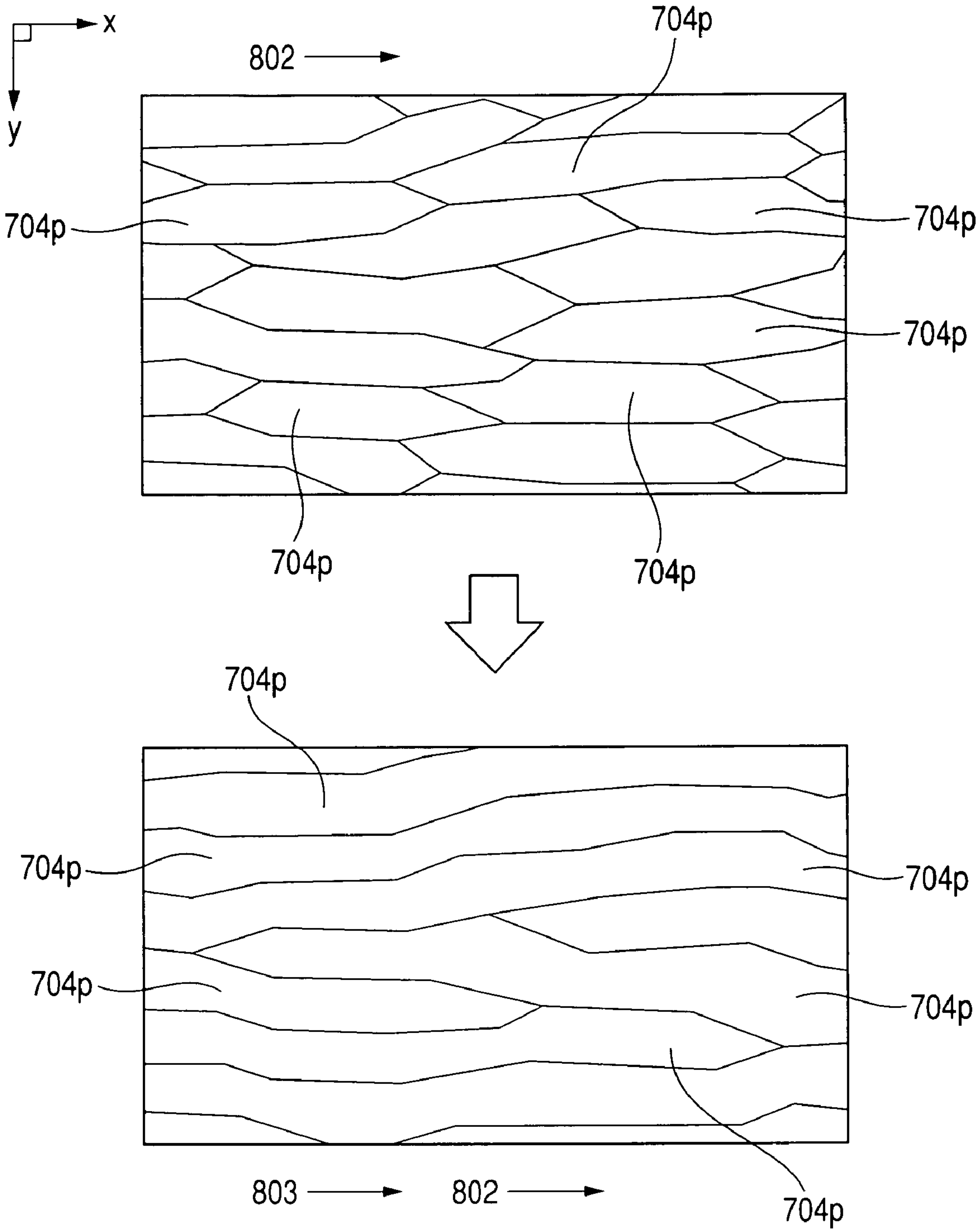
FIG. 17 is a schematic view for explaining the function and the effect of the irradiation method of continuous oscillation laser in the manufacturing method of the second embodiment.

FIG. 17 is a schematic view for explaining the function and the effect of the irradiation method of the continuous oscillation laser in the second embodiment. In the two drawings shown in FIG. 17, the drawing shown in the upper part is a schematic plan view showing the state of crystals polycrystallized from the silicon 705 melted by the method of the first embodiment and the drawing in the lower part is a schematic plan view showing the state of crystals which are polycrystallized while irradiating the third continuous oscillation laser 803 by the method of the second embodiment. Further, the two drawings shown in FIG. 17 show an identical region on the mother glass 6 by an identical size.

In a case of irradiating the second continuous oscillation laser 802 and then polycrystallizing the molten silicon 305 as it is, as in the manufacturing method described in the first embodiment, the temperature of the molten silicon 705 lowers abruptly after departing from the irradiation region of the second continuous oscillation laser 802. Accordingly, upon reaching a coagulation point, a number of nuclei are formed and a number of strip-like crystals 704*p* of a relatively shorter length in the scanning direction are formed, for example, as shown in the upper part of FIG. 17. Therefore, crystal boundaries are increased to sometimes lower the carrier mobility when the semiconductor layer of the TFT device is formed.

On the other hand, as in the second embodiment, in a case of irradiating the third continuous oscillation laser 803 to a polycrystallized region of the molten silicon 705 after departing from the irradiation region of the second continuous oscillation laser 802, since the temperature change (lowering) of the molten silicon 705 is moderated, the number of formed nuclei is decreased, for example, and crystallization proceeds such that already crystallized strip-like crystals 704*p* are grown. Accordingly, as shown in the lower part of FIG. 17, strip-like crystals 704*p* longer in the scanning direction length compared with a case of not irradiating the third continuous oscillation laser 803 are formed. Therefore, the crystal grain boundaries are decreased, and lowering of the carrier mobility can be prevented when the semiconductor layer of the TFT device is formed.

As described above, by polycrystallizing the molten silicon 705 while irradiating the third continuous oscillation laser 803, the crystal grain boundaries of the polycrystal silicon can be decreased to suppress the variation of characteristics between each of the TFT devices of the first driving circuits DRV1 and the second driving circuits DRV2.

Further, also in the second embodiment, description has been made to the manufacturing step of the TFT substrate 1 only for the step of forming the amorphous silicon film 703*a* used as the semiconductor layer for the TFT device for each of the pixels in the display region DA and forming the polycrystal silicon film 704 used as the semiconductor layer for the semiconductor devices of the first driving circuit DRV1 and the second driving circuit DRV2. Since other portions than described above are identical with those in the first embodiment, descriptions therefor are to be omitted.

Figure 18:
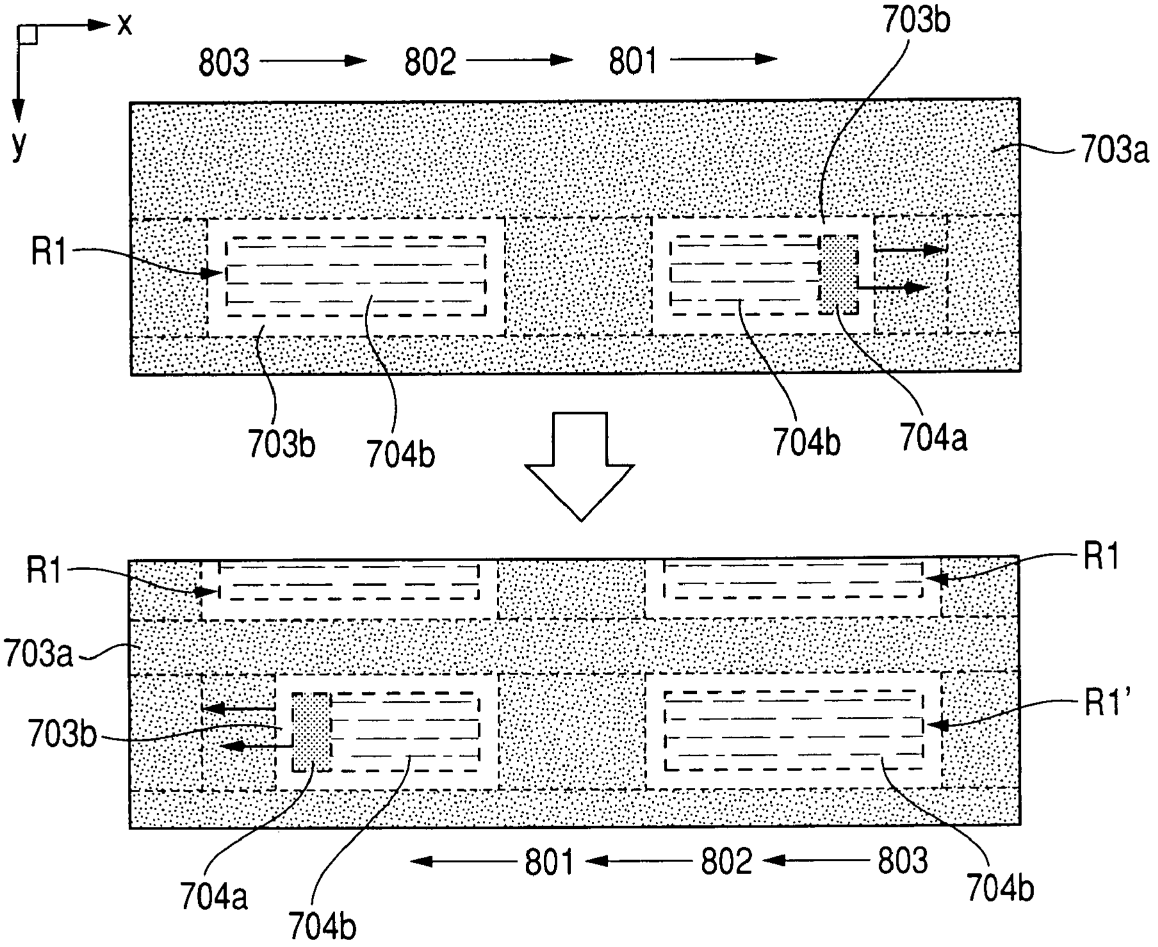
FIG. 18 is a schematic view for explaining modified example of a method of forming a polycrystal silicon in a manufacturing method of a TFT substrate according to the second embodiment.
Figure 19:
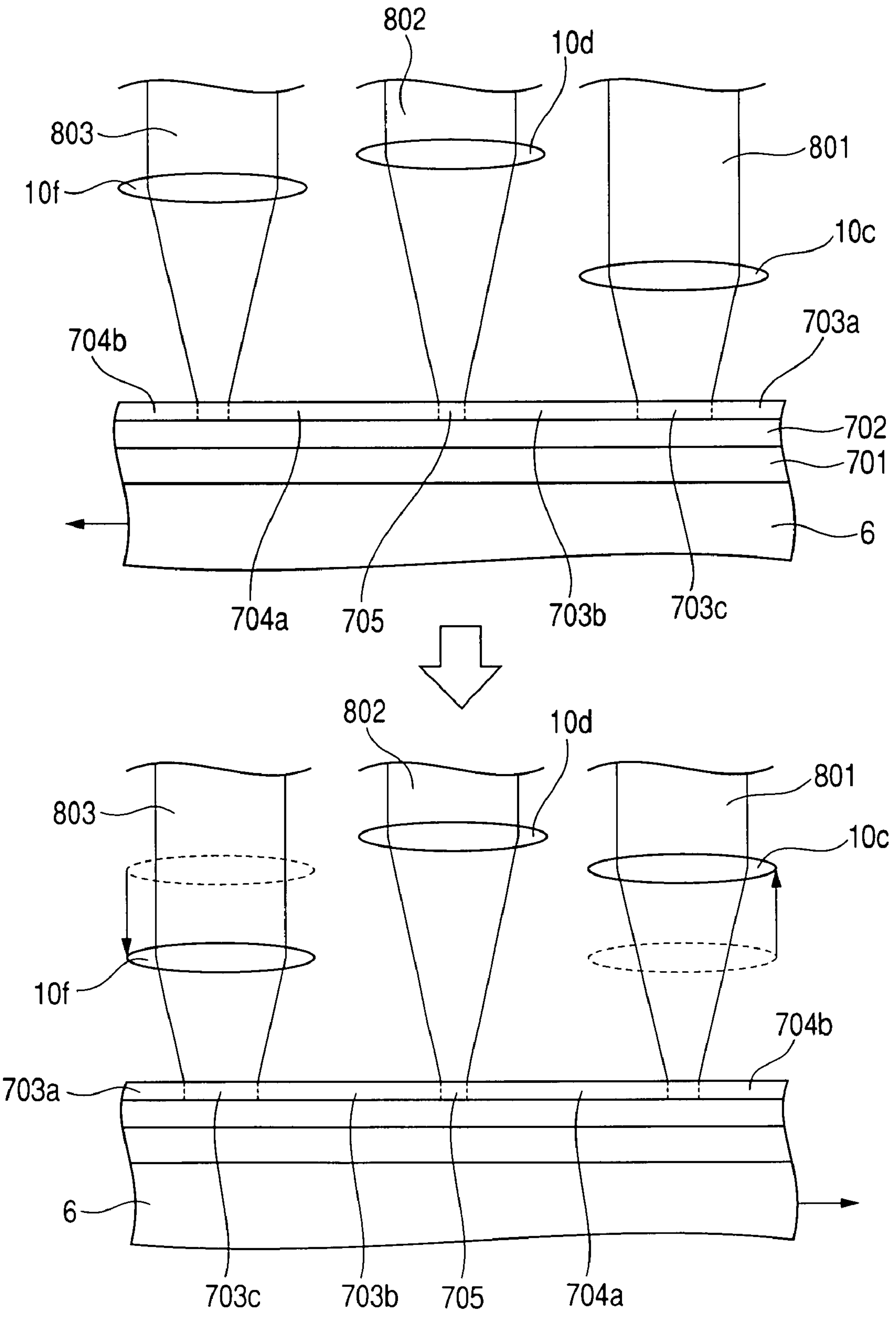
FIG. 19 is a schematic view for explaining an example of an irradiation method of a continuous oscillation laser in the method of forming a polycrystal silicon shown in FIG. 18.

FIG. 18 is a schematic view for explaining a modified example of a method of forming a polycrystal silicon in the manufacturing method of the TFT substrate of the second embodiment. FIG. 19 is a schematic view for explaining an example of an irradiation method of a continuous oscillation laser in the method of forming the polycrystal silicon shown in FIG. 18.

In the manufacturing method of the second embodiment, all the regions R1 for forming the first driving circuits can be formed into a polycrystal silicon by scanning a strip-like region on the mother glass 6 for once, for example, in a case where the regions R1 for forming the first driving circuits are present at a plurality of portions. However, there may be a case where regions R1 and R1' for forming two first driving circuits are arranged in the direction y. In this case, the polycrystal silicon 704*b* can be formed efficiently in each of the regions R1 and R1' as shown, for example, in the upper part of FIG. 18 by irradiation of a first continuous oscillation laser 801, a second continuous oscillation laser 802, and a third continuous oscillation laser 803 while scanning the strip-like region containing the region R1 for forming one driving circuit in the direction +x thereby forming a polycrystal silicon 704*b* with less crystal grain boundaries, then moving the mother glass 6 in the direction y and, as shown in the lower part in FIG. 18, irradiating the first continuous oscillation laser 801, the second continuous oscillation laser 802, and the third continuous oscillation laser 803 while scanning the strip-like region containing the region R1' for forming the other driving circuit in the direction −x thereby forming the polycrystal silicon 704*b*.

In this case, the polycrystal silicon 704*b* can also be formed by scanning the strip-like region containing the region R1 for forming one driving circuit in the direction +x thereby forming the polycrystal silicon 704*b*, then reversing the order of arranging the first continuous oscillation laser 801, the second continuous oscillation laser 802, and the third continuous oscillation laser 803, for example, by rotating the optical system 10 by 180 degree, and then scanning the strip-like region containing the region R1' for forming the other driving circuit in the direction −x. However, the angle and the irradiation position of each continuous oscillation laser in the direction y may possibly be displaced upon reversing the optical system 10.

Accordingly, in a case of forming the polycrystal silicon 704*b* in the regions R1 and R1' for forming the driving circuits by the scanning method as shown in FIG. 18, it is, for example, desirable to change the energy distribution and the energy density of the first continuous oscillation laser 801, and the energy distribution and the energy density of the third continuous oscillation laser 803 in accordance with the scanning direction (moving direction). That is, in a case of forming the polycrystal silicon 704*b* by scanning the strip-like region containing the region R1 for forming one driving circuit in the direction +x, as shown in the upper part of FIG. 19, the position for the first lens 10*c*, the second lens 10*d*, and the third lens 10*f* are changed to adjust the focal point or the beam width to form the first continuous oscillation laser 801 into a beam suitable to dehydrogenation of the amorphous silicon 703*a*, the second continuous oscillation laser 802 into a beam suitable to melting of the dehydrogenated amorphous silicon 703*b*, and the third continuous oscillation laser 803 into a beam suitable to post-annealing the polycrystal silicon 704*a*, and they are irradiated. Then, in a case of forming the polycrystal silicon 704*b* by scanning the strip-like region containing the region R1' for forming the other driving circuit in the direction −x, the focal point and the beam width are controlled by changing the position for the first lens 10*c* and the third lens 10*f* to form the first continuous oscillation laser 801 into a beam suitable to post-annealing of the polycrystal silicon 704*a*, the second continuous oscillation laser 802 into a beam suitable to melting of the dehydrogenated amorphous silicon 703*b*, and the third continuous oscillation laser 803 into a beam suitable to dehydrogenation of the amorphous silicon 703*a* and they are irradiated as shown for example in the lower part of FIG. 19.

As described above, by replacing the role of the first continuous oscillation laser 801 and the role of the third continuous oscillation laser 803 depending on the scanning direction, the polycrystal silicon 704*b* can be formed in each of the regions R1, R1, for example, without reversing the optical system 10. Accordingly, displacement of the angle and the irradiation position of each of the continuous oscillation lasers in the direction y can be prevented.

Further, in the manufacturing method of the second embodiment, it is of course possible to generate and irradiate the first continuous oscillation laser 801, the second continuous oscillation laser 802, and the third continuous oscillation laser 803, for example, by the combination of laser oscillators and the optical systems independent of each other.

Further, in the manufacturing method of the second embodiment, description has been made to a method of conducting post-annealing in the course of polycrystallizing the molten silicon 705 while considering the crystallization of the dehydrogenated amorphous silicon 703*b* and post-annealing by the third continuous oscillation laser 803 as one step. However, it will be apparent that the manufacturing method of the second embodiment is not restricted thereto but, for example, a step of dehydrogenating the amorphous silicon by irradiating the first continuous oscillation laser 801 and the step of polycrystallizing the dehydrogenated amorphous silicon by irradiating the second continuous oscillation laser 802 and the third continuous oscillation laser 803 may be separated. Basically, the irradiation position of the third continuous oscillation laser 803 is preferably closer to the irradiation position of the second continuous oscillation laser 802 and it is preferred that the moving speed (scanning speed) of the second continuous oscillation laser 802 is made identical with the moving speed (scanning speed) of the third continuous oscillation laser 803. However, this is not restrictive but it will be apparent that the moving speed of the second continuous oscillation laser 802 may be different from the moving speed of the third continuous oscillation laser 803.

Further, in a case of conducting dehydrogenation of the amorphous silicon and the polycrystallization of silicon separately, it is preferred, for example, to conduct the dehydrogenation in an oxygen atmosphere and the polycrystallization of silicon, for example, in an inert gas atmosphere.

While the invention has been described specifically with reference to the preferred embodiments, it will be apparent that the invention is not restricted to the embodiments described above but may be modified variously within a scope not departing the gist thereof.

For example, while the first embodiment and the second embodiment show a case of modification into the strip-like crystals extending lengthwise in one direction (pseudo single crystals) 704*p* by the irradiation of the second continuous oscillation laser, this is not restrictive but it may be modified into polycrystal silicon constituted with granular crystals or microcrystals by the irradiation of the second continuous oscillation laser. Further, a continuous oscillation laser may be irradiated subsequently to the granular crystals or microcrystals to modify them into the pseudo single crystals. Further, the shape and the size of each of the crystals constituting the polycrystal silicon can be changed by changing the energy density and the scanning speed of the continuous oscillation laser. This can form the polycrystal silicon not restricted only to the strip-like crystals 704*p* but also a polycrystal silicon comprising an assembly of microcrystals with the grain size of 0.3 μm or less or a polycrystal silicon comprising an assembly of granular crystals with a grain size of about from 0.3 μm to 1 μm.

Further, in the first embodiment and the second embodiment, while the manufacturing method has been explained with reference to the TFT substrate 1 used for the active matrix type liquid crystal display panel as an example, the invention is not restricted only thereto but it will be apparent that this can be applied to the manufacturing method of a substrate having a constitution identical with that of the TFT substrate 1 (display panel) shown in FIG. 2 and FIG. 3. That is, the manufacturing method of the display device according to the invention can be applied to any of such substrates so long as they are substrates having an integrated circuit such as a driving circuit to the outside of the display region, forming the semiconductor laser for the TFT device in the display region with an amorphous silicon, and forming the semiconductor layer of the semiconductor device of the integrated circuit with a polycrystal silicon. Those capable of being applied with the manufacturing method of the invention include, for example, self-light emitting type display panels using organic EL electroluminescence, in addition to the TFT substrate 1 of the active matrix type liquid crystal display panel.

Further, while an example of polycrystallizing the amorphous silicon is referred to in the first embodiment and the second embodiment, it will be apparent this is not restrictive but other semiconductor materials may also be used.

What is claimed is:

1. A method of manufacturing a display device, the method comprising;

a first step of depositing a hydrogenated amorphous silicon on a substrate and a second step of dehydrogenating a predetermined region of the hydrogenated amorphous silicon and then melting and crystallizing the amorphous silicon in a dehydrogenated region into polycrystal silicon, a step of forming a plurality of pixels having TFT devices using an amorphous silicon in a display region of the substrate, and forming a driving circuit having a plurality of semiconductor devices using the polycrystal silicon to the outside of the display region, wherein in the second step, a first continuous oscillation laser is irradiated only to the region of forming the driving circuit and the peripheral region thereof at the outside of the display region of the substrate to conduct dehydrogenation, and a second continuous oscillation laser is irradiated only to the dehydrogenated region to transform the amorphous silicon into the polycrystal silicon; and the region to which the first continuous oscillation laser is irradiated is wider than the region to which the second continuous oscillation laser is irradiated.

2. The method of manufacturing a display device according to claim 1, wherein the first continuous oscillation laser and the second continuous oscillation laser are irradiated while scanning over the substrate;

the energy density of the first continuous oscillation laser is lower than the energy density of the second continuous oscillation laser; and the time for the irradiation of the first continuous oscillation laser is longer than the time for the irradiation of the second continuous oscillation laser on each of the points in the region for the irradiation of the first continuous oscillation laser and the second continuous oscillation laser.

3. The method of manufacturing a display device according to claim 2, wherein the beam width of the first continuous oscillation laser in the scanning direction is wider than the beam width of the second continuous oscillation laser in the scanning direction.

4. The method of manufacturing a display device according to claim 2, wherein the scanning speed of the first continuous oscillation laser is different from the scanning speed of the second continuous oscillation laser.

5. The method of manufacturing a display device according to claim 4, wherein the scanning speed of the first continuous oscillation laser is lower than the scanning speed of the second continuous oscillation laser.

6. The method of manufacturing a display device according to claim 1, wherein in the second step, irradiation is performed with the first continuous oscillation laser and the second continuous oscillation laser during scanning of a strip-like region on the substrate in a first direction.

7. The method of manufacturing a display device according to claim 6, wherein in the second step, scanning is performed on a strip-like region on the substrate in the first direction and then scanning is performed on a strip-like region different from said strip-like region on the substrate in a direction opposite to the first direction.

8. The method of manufacturing a display device according to claim 1, wherein in the second step, a third continuous oscillation laser is irradiated to a region formed into polycrystal silicon by the irradiation of the second continuous oscillation laser.

9. The method of manufacturing a display device according to claim 8, wherein in the second step, the first continuous oscillation laser, the second continuous oscillation laser, and the third continuous oscillation laser are irradiated during scanning of a strip-like region on the substrate in the first direction.

10. The method of manufacturing a display device according to claim 8, wherein in the second step, scanning is performed on a strip-like region of the substrate in the first direction, then scanning is performed on a strip-like region different from said strip-like region in the direction opposite to the first direction; and when scanning the different stripe-like region, the third continuous oscillation laser is irradiated to dehydrogenate the hydrogenated amorphous silicon film;

the second continuous oscillation laser is irradiated to the amorphous silicon dehydrogenated by the third continuous oscillation laser into polycrystal silicon; and the first continuous oscillation laser is irradiated to the region formed into the polycrystal silicon by the irradiation of the second continuous oscillation laser.

11. The method of manufacturing a display device according to claim 10, wherein the focal point of the first continuous oscillation laser and the focal point of the third continuous oscillation laser are switched to each other between the scanning in the first direction and the scanning in the direction opposite to the first direction on the substrate.

12. A method of manufacturing a liquid crystal display device having a liquid crystal display panel in which liquid crystals are put between a substrate and an opposed substrate, the method including;

a first step of depositing a hydrogenated amorphous silicon film on the substrate, and a second step of dehydrogenating a predetermined region of the hydrogenated amorphous silicon film and then melting and crystallizing the amorphous silicon in the dehydrogenated region into a polycrystal silicon, a step of forming a plurality of pixels having TFT devices using the amorphous silicon in a display region of the substrate and forming a driving circuit having a plurality of semiconductor devices using the polycrystal silicon to the outside of the display region, wherein in the second step, a first continuous oscillation laser is irradiated only to the region for forming the driving circuit and the peripheral region thereof at the outside of the display region of the substrate to conduct dehydrogenation, and a second continuous oscillation laser is irradiated only to the dehydrogenated region to form the amorphous silicon into the polycrystal silicon, and the region to which the first continuous oscillation laser is irradiated is wider than the region to which the second continuous oscillation laser is irradiated.

13. The method of manufacturing a liquid crystal display device according to claim 12, wherein the first continuous oscillation laser and the second continuous oscillation laser are irradiated while scanning over the substrate;

the energy density of the first continuous oscillation laser is lower than the energy density of the second continuous oscillation laser; and the time for the irradiation of the first continuous oscillation laser is longer than the time for the irradiation of the second continuous oscillation laser on each of points in the region irradiated by the first continuous oscillation laser and the second continuous oscillation laser.

14. The method of manufacturing a liquid crystal display device according to claim 13, wherein the beam width of the first continuous oscillation laser in the scanning direction is wider than the beam width of the second continuous oscillation laser in the scanning direction.

* * * * *